(12) United States Patent
Horiguchi

(10) Patent No.: US 7,042,753 B2
(45) Date of Patent: May 9, 2006

(54) MULTI-VALUE MAGNETIC RANDOM ACCESS MEMORY WITH STACKED TUNNEL MAGNETORESISTANCE (TMR) ELEMENTS

(75) Inventor: Fumio Horiguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 663 days.

(21) Appl. No.: 10/073,339

(22) Filed: Feb. 13, 2002

(65) Prior Publication Data

US 2002/0149962 A1 Oct. 17, 2002

(30) Foreign Application Priority Data

Feb. 14, 2001 (JP) ............... 2001-037140

(51) Int. Cl.
*G11C 11/15* (2006.01)
(52) U.S. Cl. .................. 365/130; 365/133; 365/158; 365/173; 365/171; 365/51; 365/66; 365/209
(58) Field of Classification Search ............ 365/158, 365/173, 171, 130, 132, 133, 51, 66, 63, 365/210, 209, 189.05
See application file for complete search history.

(56) References Cited

U.S. PATENT DOCUMENTS

| | | | | |
|---|---|---|---|---|
| 5,835,314 | A | 11/1998 | Moodera et al. | 360/324.2 |
| 5,894,447 | A | 4/1999 | Takashima | 365/158 |
| 5,930,164 | A | 7/1999 | Zhu | 365/158 |
| 6,169,688 | B1 | 1/2001 | Noguchi | 365/171 |
| 6,445,613 | B1 * | 9/2002 | Nagai | 365/171 |
| 6,504,752 | B1 * | 1/2003 | Ito | 365/158 |
| 6,670,660 | B1 * | 12/2003 | Hosotani | 257/295 |
| 6,724,653 | B1 * | 4/2004 | Iwata et al. | 365/158 |
| 6,795,334 | B1 * | 9/2004 | Iwata et al. | 365/158 |
| 6,804,144 | B1 * | 10/2004 | Iwata | 365/158 |
| 6,839,269 | B1 * | 1/2005 | Iwata et al. | 365/158 |
| 2001/0035545 | A1 * | 11/2001 | Schuster-Woldan et al. | 257/296 |
| 2002/0141233 | A1 * | 10/2002 | Hosotani et al. | 365/158 |
| 2003/0123271 | A1 * | 7/2003 | Iwata | 365/63 |
| 2003/0198080 | A1 * | 10/2003 | Iwata | 365/158 |

FOREIGN PATENT DOCUMENTS

| | | |
|---|---|---|
| JP | 9-260743 | 10/1997 |
| JP | 2000-331473 | 11/2000 |
| JP | 2001-217398 | 8/2001 |
| JP | 2001-357666 | 12/2001 |

OTHER PUBLICATIONS

U.S. Appl. No. 10/073,339, filed Feb. 13, 2002, Pending.

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A memory cell is constituted by a TMR element and a MOS transistor. The source diffusion layer of the MOS transistor is connected to a source line and the drain diffusion layer of the transistor is connected to a TMR element via a local interconnection wire. The TMR element is held between the local interconnection wire and a bit line. The TMR element is constituted by stacked TMR layers. Each TMR layer is able to have two states, that is, a state in which spin directions are parallel and anti-parallel. Therefore, the TMR element stores four-value data. A current-driving line is set immediately below the TMR element.

20 Claims, 18 Drawing Sheets

TMR (TUNNEL MAGNETO-RESISTANCE) ELEMENT
A, B: FERROMAGNETIC LAYER
C : TUNNELING BARRIER
D : ANTIFERROMAGNETIC LAYER

PARALLEL (LOW RESISTANCE)    ANTI-PARALLEL (HIGH RESISTANCE)

TMR EFFECT

STACKED TMR TYPE MRAM'S MEMORY

COLUMN DIRECTION

STACKED TMR STRUCTURE (2 SETS TYPE)

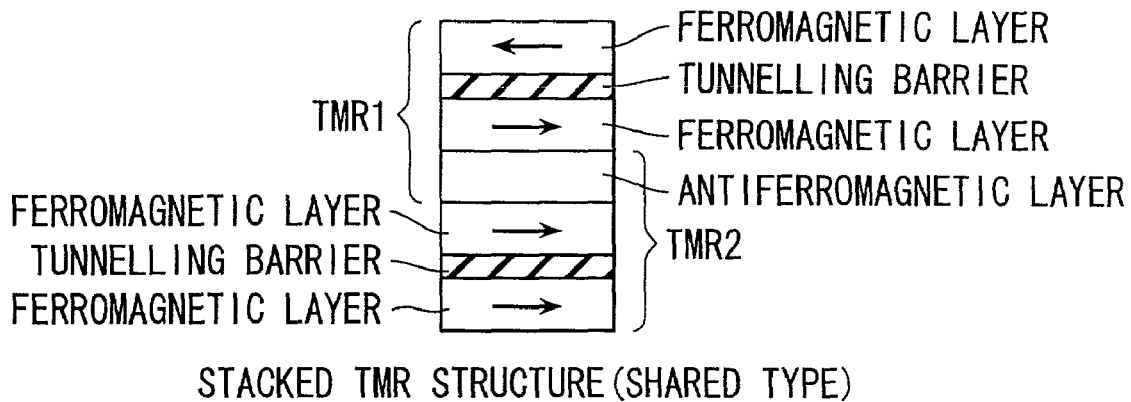
STACKED TMR STRUCTURE (SHARED TYPE)
FIG. 10
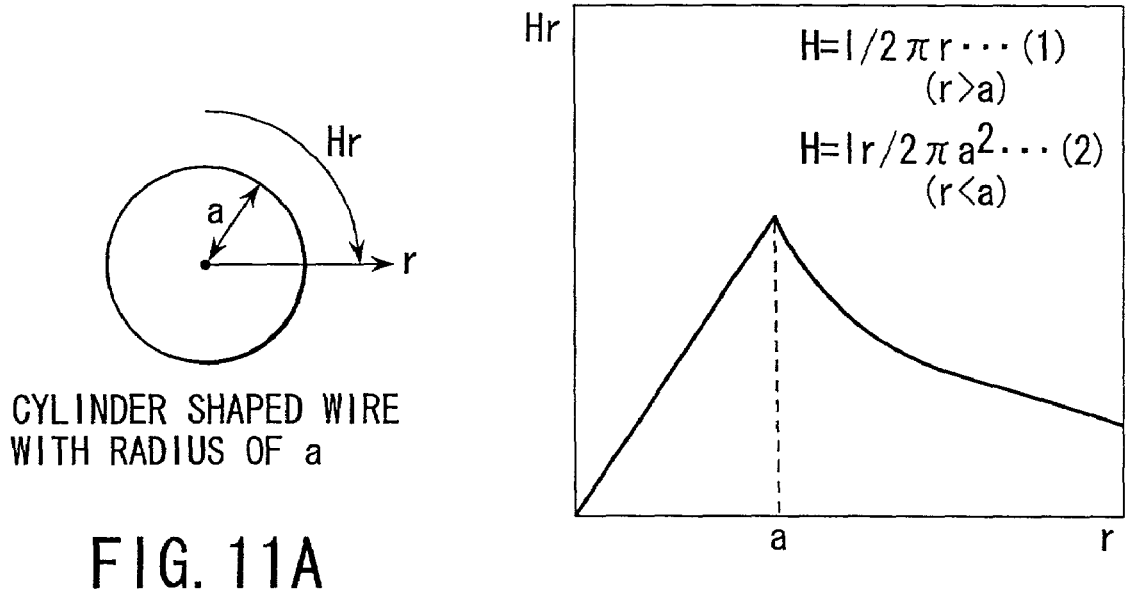
CYLINDER SHAPED WIRE
WITH RADIUS OF a
FIG. 11A
$$H = I/2\pi r \cdots (1)$$
$$(r > a)$$
$$H = Ir/2\pi a^2 \cdots (2)$$
$$(r < a)$$
RELATIONSHIP BETWEEN DISTANCE r
FROM CENTER OF WIRE AND MAGNETIC
FIELD INTENSITY
FIG. 11B

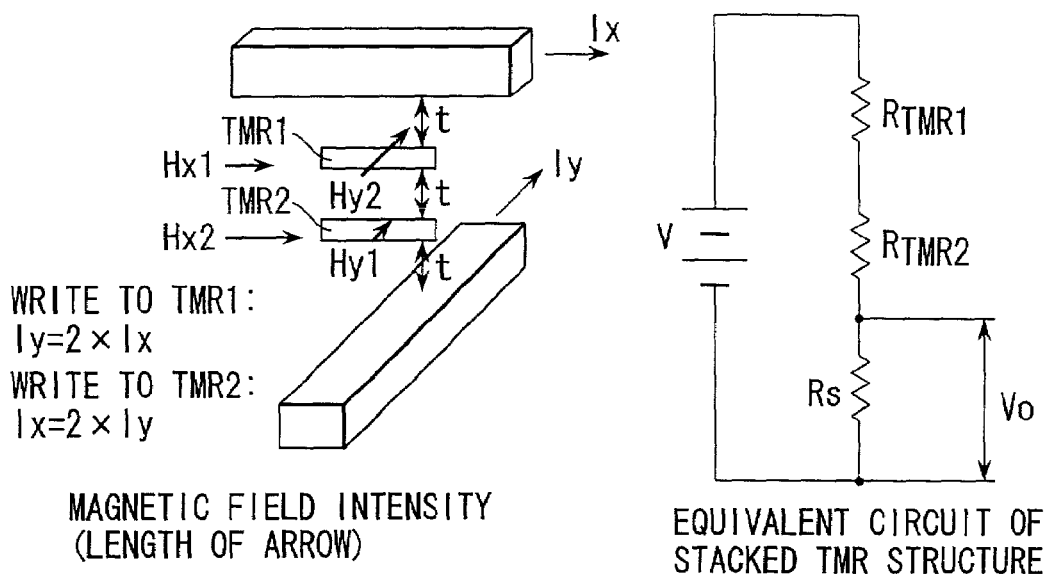
FIG. 12
MAGNETIC FIELD INTENSITY
(LENGTH OF ARROW)
WRITE TO TMR1:
Iy=2×Ix
WRITE TO TMR2:
Ix=2×Iy
FIG. 14
EQUIVALENT CIRCUIT OF
STACKED TMR STRUCTURE
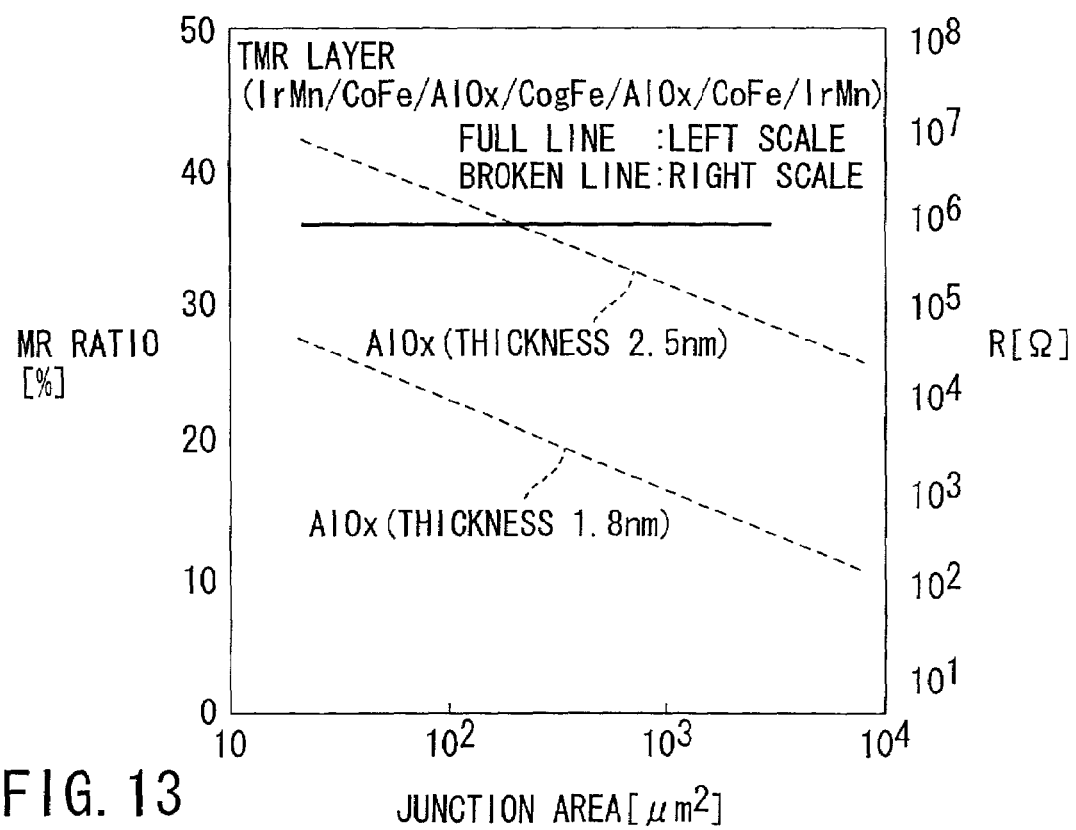
FIG. 13

MULTI-VALUE MAGNETIC RANDOM ACCESS MEMORY WITH STACKED TUNNEL MAGNETORESISTANCE (TMR) ELEMENTS

CROSS-REFERENCE TO RELATED APPLICATIONS

This application is based upon and claims the benefit of priority from the prior Japanese Patent Application No. 2001-37140, filed Feb. 14, 2001, the entire contents of which are incorporated herein by reference.

BACKGROUND

The present invention relates to a magnetic random access memory (MRAM) in which a memory cell is constituted by a TMR element for storing data values "1" and "0" in accordance with the tunneling magneto resistive effect.

Recently, many memories for respectively storing data in accordance with a new principle are proposed. One of the memories is a memory using the tunneling magneto resistive (hereafter referred to as TMR) effect, which is proposed by Roy Scheuerlein et al (refer to ISSCC2000 Technical Digest p. 128 "A 10-ns Read and Write Non-Volatile Memory Array Using a Magnetic Tunnel Junction and FET Switch in each Cell").

A magnetic random access memory stores data values "1" and "0" by a TMR element. As shown in FIG. 1, the TMR element has a structure in which an insulating layer (tunneling barrier) is held by two magnetic layers (ferromagnetic layers). The data stored in the TMR element is determined by the fact whether spin directions of two magnetic layers are parallel or anti-parallel.

In this case, as shown in FIG. 2, "parallel" denotes that spin directions of two magnetic layers are parallel and "anti-parallel" denotes that spin directions of two magnetic layers are opposite to each other (direction of the arrow shows a spin direction).

In general, an anti-ferromagnetic layer is formed on one of two magnetic layers. An anti-ferromagnetic layer is a member for easily rewriting data by fixing the spin direction of one magnetic layer and changing only spin directions of the other magnetic layer.

As shown in FIG. 2, when spin directions of two magnetic layers become parallel, the tunneling resistance of an insulating layer (tunneling barrier) held by these two magnetic layers is minimized. This state is referred to as "1"-state. Moreover, when spin directions of the two magnetic layers become anti-parallel, the tunneling resistance of the insulating layer (tunneling barrier) held by these two magnetic layers is maximized. This state is referred to as "0"-state.

Then, the principle of write-operation to a TMR element is briefly described below by referring to FIG. 3.

A TMR element is set to the intersection between a word line WWLI and a data selection line (bit line) BLj which intersect with each other. Then, write is achieved by supplying current to using the write word line WWLi and data selection line BLj, using a magnetic field generated by the current circulating through the both lines, and thereby making spin directions of TMR elements parallel or anti-parallel.

For example, only a current flowing in one direction is supplied to the data selection line BLj and a current flowing in one direction or other direction is supplied the write-word line WWLi in accordance with write data under write. When supplying the current flowing in one direction to the write word line WWLi, spin directions of a TMR element become parallel ("1"-state). When supplying a current flowing in other direction to the write word line WWLi, spin directions of the TMR element become anti-parallel ("0"-state).

A mechanism for spin directions of a TMR element to change is described below.

As shown by the TMR curve in FIG. 4, when applying a magnetic field Hx in the major-side (Easy Axis) direction of a TMR element, resistance values of the TMR element change by approx. 17%. The change rate, that is, the ratio between resistance values before and after change is referred to as an MR ratio.

MR ratios are changed due to the property of a magnetic layer. A TMR element having an MR ratio of approx. 50% is obtained at present.

A synthetic magnetic field of a magnetic field Hx in Easy-Axis direction and a magnetic field Hy in Hard-Axis direction is applied to a TMR element. As shown by full lines and broken lines in FIG. 4, intensities of the magnetic field Hx in Easy-Axis direction required to change resistance values of the TMR element are also changed due to the intensity of the magnetic field Hy in Hard-Axis direction. By using this phenomenon, it is possible to write data in only a TMR element present at the intersection between a selected write word line and a selected data selection line among memory cells arrange like an array.

The above state is further described below by using the ateroid curve in FIG. 5.

The full line in FIG. 5 shows the asteroid curve of a TMR element MR1. That is, when the intensity of the synthetic magnetic field of the magnetic field Hx in Easy-Axis direction and the magnetic field Hy in Hard-Axis direction is present at the outside (e.g. position of a black circle) of the asteroid curve (full line), it is possible to invert the spin direction of a magnetic layer.

However, when the intensity of the synthetic magnetic field of the magnetic field Hx in Easy-Axis direction and the magnetic field Hy in Hard-Axis direction is present at the inside (e.g. position of a white circle) of the asteroid curve (full line), it is impossible to invert the spin direction of a magnetic layer.

Therefore, it is possible to control the write of data to a TMR element by changing intensities of the magnetic field Hx in Easy-axis direction and the magnetic field Hy in Hard-axis direction and changing positions of the intensity of the synthetic magnetic field in the Hx-Hy plane.

It is possible to easily perform read by supplying a current to a selected TMR element and detecting the resistance value of the TMR element.

For example, a current path is formed by connecting switching elements to a TMR element in series and turning on only a switching element connected to a read word line. As a result, because a current is supplied to only a selected TMR element, it is possible to read data from the TMR element.

In recent years, it has been an indispensable art to increase the capacity of a memory.

In the case of a conventional memory, to increase its capacity, the memory cell area of an element is decreased by fining the element, memory cells are three-dimensionally arranged, or data of three values or more (or data of a plurality of bits) is stored in memory cells.

However, fining of an element is limited. Moreover, in the case of a magnetic random access memory, a memory cell conventionally includes only one TMR element. Furthermore, the TRM element is constituted by one insulating layer (tunneling barrier) and two magnetic layers (ferromagnetic layers) hosing the insulating layer.

That is, because a TMR element can have only two states in which spin directions of two magnetic layers are parallel and anti-parallel, a memory cell can only store one-bit data.

SUMMARY

An according to an aspect of the invention, there is provided a magnetic random access memory comprising a TMR element configured to store data; and first and second current driving lines configured to generate a magnetic field for storing the data to the TMR element, and to cross each other; wherein the TMR element includes stacked TMR layers, and each has magnetic layers and a insulating layer between the magnetic layers.

BRIEF DESCRIPTION OF THE DRAWINGS

FIG. 10 is an illustration showing another TMR element of an MRAM of the present invention;

FIG. 11A is an illustration showing a cylinder-shaped wire for the relationship in FIG. 11B;

FIG. 11B is an illustration showing the relationship between the magnetic-field intensity and the distance from the center of the cylinder-shaped wire;

FIG. 12 is an illustration showing the magnetic-field intensity to be applied to a memory cell;

FIG. 13 is an illustration showing the relation between the MR ratio, resistance, and junction area of a TMR layer;

FIG. 14 is an illustration showing an equivalent circuit of a stacked TMR element;

DETAILED DESCRIPTION OF THE INVENTION

A magnetic random access memory of an aspect of the present invention is described below in detail by referring to the accompanying drawings.

The magnetic random access memory of an aspect of the present invention has a device structure capable of storing data of three values or more (or data of a plurality of bits) in one memory cell. In this case, it is assumed that a memory cell is constituted by a TMR element or a combination of the TMR element with a switching element. Therefore, a TMR element is first described below.

[TMR Element]

Figure 1:
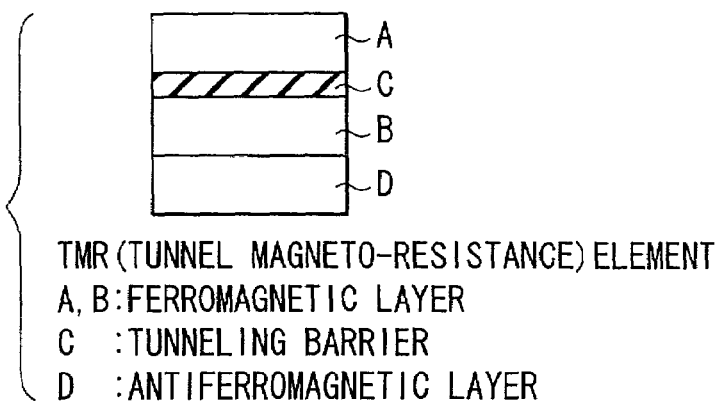
FIG. 1 is an illustration showing a conventional TMR element.
Figure 2:
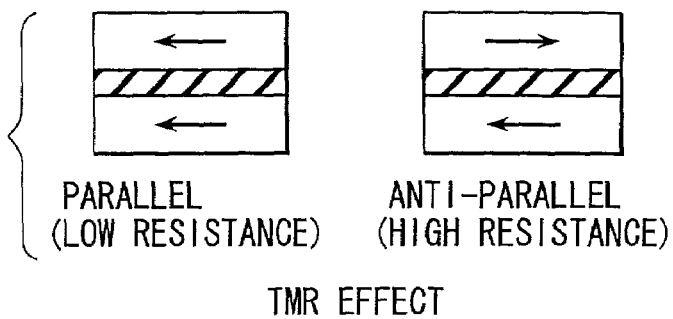
FIG. 2 is an illustration showing a state of a TMR element after the write operation.
Figure 3:
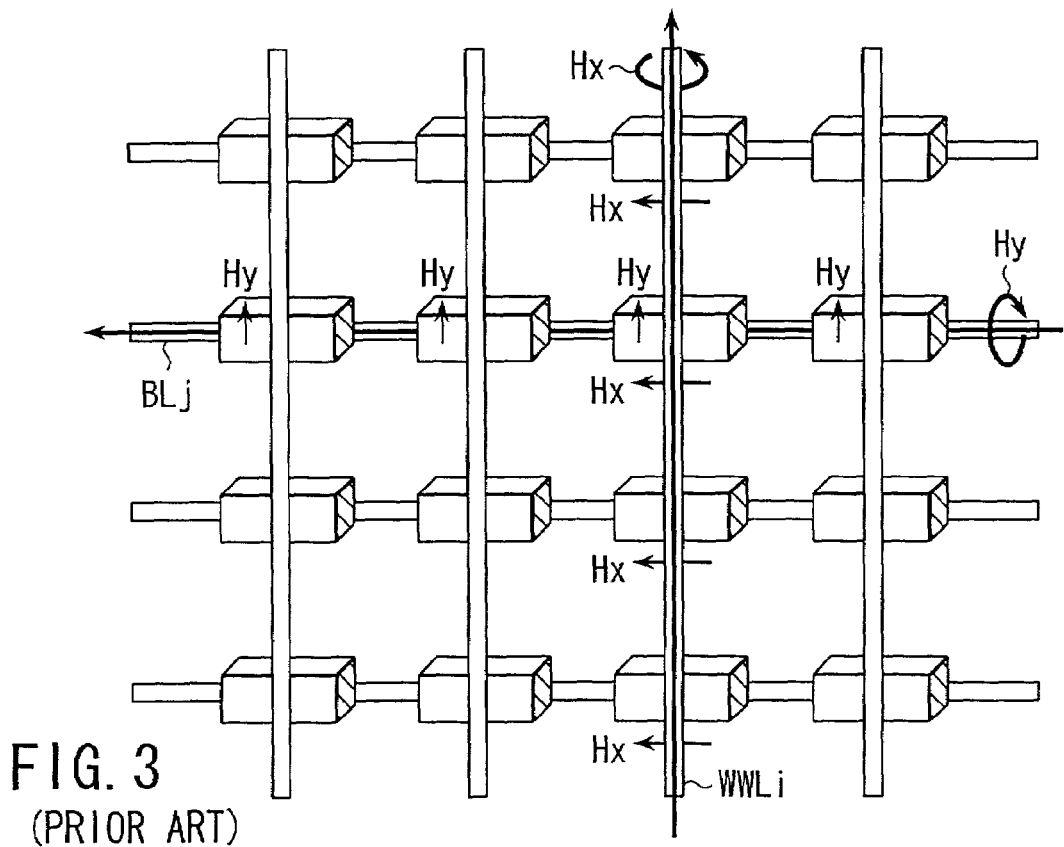
FIG. 3 is an illustration showing the principle of write operation of a conventional MRAM.
Figure 4:
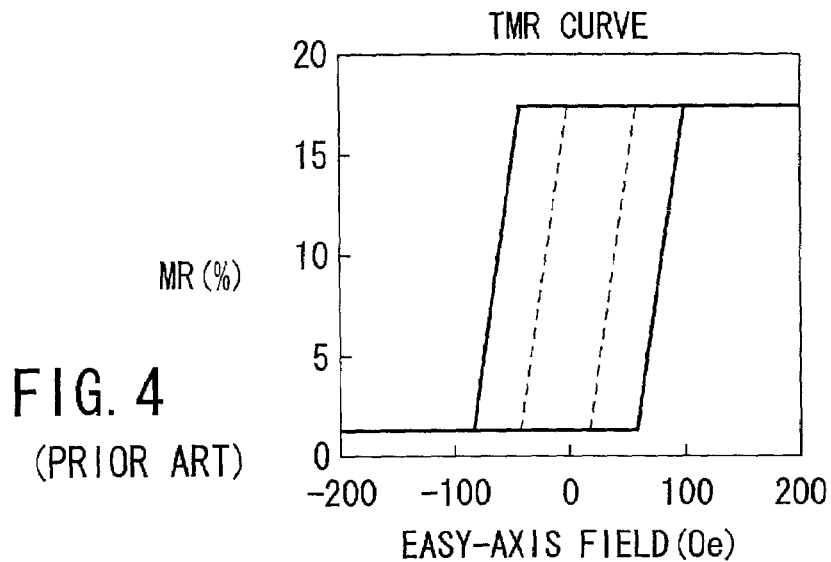
FIG. 4 is an illustration showing a TMR curve.

Data is stored in a TMR element as a magnetized state (state in which spin directions of two magnetic layers are parallel or anti-parallel). As shown in FIG. 1, a conventional TMR element is basically constituted by an insulating layer and two magnetic layers for holding the insulating layer (tunneling barrier).

Therefore, the TMR element can store only data of two values (one bit) but it does not store data of three values or more (or data of a plurality of bits). In this case, to make the following description understandable, a combination of an insulating layer (tunneling barrier) with two magnetic layers for holding the insulating layer is referred to as "TMR layer".

Thus, because a conventional TMR element is constituted by only one TMR layer, only data of two values (one bit) can be stored in one memory cell (or TMR element).

In the case of the present invention, however, data of three values or more (or data of a plurality of bits) is stored in one memory cell by constituting a TMR element by a plurality of TMR layers and controlling magnetized states of these TMR layers.

A plurality of TMR layers constituting one TMR element are stacked each other and naturally united into one body.

Figure 6:
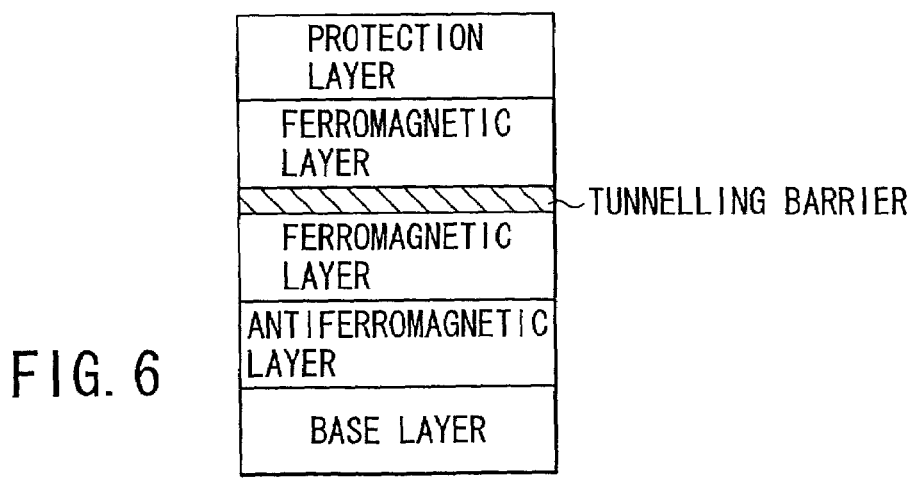
FIG. 6 is an illustration showing a TMR element.
Figure 7:
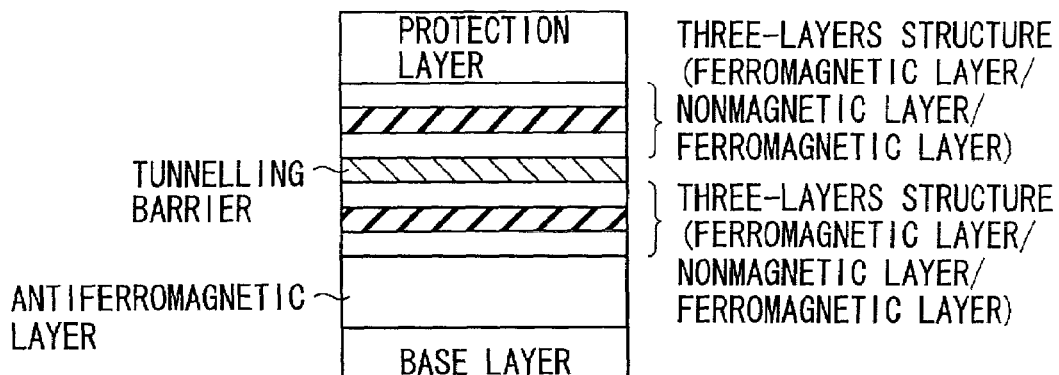
FIG. 7 is an illustration showing another TMR element.

It is desirable that a TMR layer has the structure shown in FIG. 6 or 7. The structure in FIG. 6 is the same as that shown in FIG. 1. That is, in FIG. 6, it can be considered that the TMR element (TMR layer) in FIG. 1 is set between a base and a protection layer. The structure in FIG. 7 can be considered as a structure obtained by changing the ferromagnetic layer in FIG. 6 to a three-layer structure constituted by a ferromagnetic layer, a non-magnetic layer, and a ferromagnetic layer.

Though a ferromagnetic layer is not restricted, it is possible to use one of Fe, Co, and Ni or an alloy of these substances, an oxide such as magnetite, $CrO_2$, or $RXMnO_{3-y}$ (R: rare earth, X: Ca, Ba, or Sr) having a large polarizability, or a Heusler alloy such as MiMnSb or PtMnSb.

Moreover, there is no problem at all even if a ferromagnetic layer slightly contains nonmagnetic elements such as Ag, Cu, Au, Al, Mg, Si, Bi, Ta, B, C, O, N, Pd, Pt, Zr, Ir, W, Mo, and Nb.

When a ferromagnetic layer is too thin, it loses the super-paramagnetism. Therefore, a ferromagnetic layer requires at least a thickness at which the layer does not become super-paramagnetic. Specifically, the thickness of a ferromagnetic layer is set to 0.1 nm or more, preferably set between 0.4 and 100 nm (both included).

It is preferable to fix the magnetized state (spin direction) of one of two magnetic layers (ferromagnetic layers). Therefore, when using one of two magnetic layers as a magnetism-fixed layer in which the magnetized state is fixed, an anti-magnetic layer (anti-ferromagnetic layer) is set adjacently to the magnetism-fixed layer.

The anti-magnetic layer has a function of preventing a magnetism-fixed layer from being easily influenced by a current magnetic field and preventing the spin direction of the magnetism-fixed layer from changing (but changing only magnetized states of another magnetic layer which is not a magnetism-fixed layer).

An anti-magnetic layer can use any one of Fe—Mn, Pt—Mn, Pt—Cr—Mn, Ni—Mn, Ir—Mn, NiO, and $Fe_2O_3$.

The example in FIG. 7 proposes a structure in which an insulating layer (tunneling barrier) is held by two laminated films constituted by a ferromagnetic layer and a non-magnetic layer. It is possible to form a three-layer structure (laminated film) constituted by a ferromagnetic layer, a non-magnetic layer, and a ferromagnetic layer by Co(Co—Fe), Ru, and Co(Co—Fe) or Co(Co—Fe), Ir, and Co(Co—Fe).

By using the above structure, when using one of two laminated films as a magnetism-fixed layer, the magnetized state of the magnetism-fixed layer is not further easily influenced by a current magnetic field under write and thereby, the magnetized state is fixed.

When using any one of the TMR layers (or laminated films) in FIGS. 6 and 7 as a magnetism-fixed layer, the other magnetic layer (or laminated film) is used as a magnetic recording layer. An anti-ferromagnetic layer is not formed adjacently to the anti-ferromagnetic layer and therefore, it is possible to change magnetized states (spin directions) of the magnetic recording layer by a current magnetic field generated under write.

When using a two-layer film constituted by a soft ferromagnetic layer and a ferromagnetic layer or a three-layer film constituted by a ferromagnetic layer, a soft ferromagnetic layer, and a ferromagnetic layer, and an interaction works between anti-ferromagnetic layers due to a non-magnetic layer, it is possible to prevent a switching magnetic field from being intensified due to a magnetic pole because a magnetic flux closes in a magnetic recording layer.

That is, by using the above structure, an advantage can be obtained that the power consumption of a current magnetic field is not increased even if the size of a memory cell becomes sub-micron or less.

Moreover, it is desirable to form a three-layer film constituted by a ferromagnetic layer, a non-magnetic layer, and a ferromagnetic layer. It is allowed to form a two-layer film constituted by a soft ferromagnetic layer and a ferromagnetic layer or a three-layer film constituted by a ferromagnetic layer, a soft ferromagnetic layer, and a ferromagnetic layer on the above three layer film (soft layer).

An insulating layer (tunneling barrier) can use any one of dielectrics such as $Al_2O_3$, $SiO_2$, MgO, AlN, $Bi_2O_3$, $MgF_2$, $CaF_2$, $SrTiO_2$, and $AlLaO_3$. These dielectrics can be used even if oxygen deficiency, nitrogen deficiency, and fluorine deficiency are present.

Though it is preferable that the thickness of an insulating layer (tunneling barrier) is as small as possible, there is no restriction to realize the function of the layer. However, the thickness of an insulating layer is set to 10 nm or less when the layer is formed.

As described above, in the case of the present invention, one TMR element is constituted by stacking a plurality of TMR layers as shown in FIG. 6 or 7. Thereby, also in the case of a magnetic random access memory, it is possible to store data of three values or more (or data of a plurality of bits) in one memory cell (or TMR element).

FIRST EXAMPLE

Figure 8:
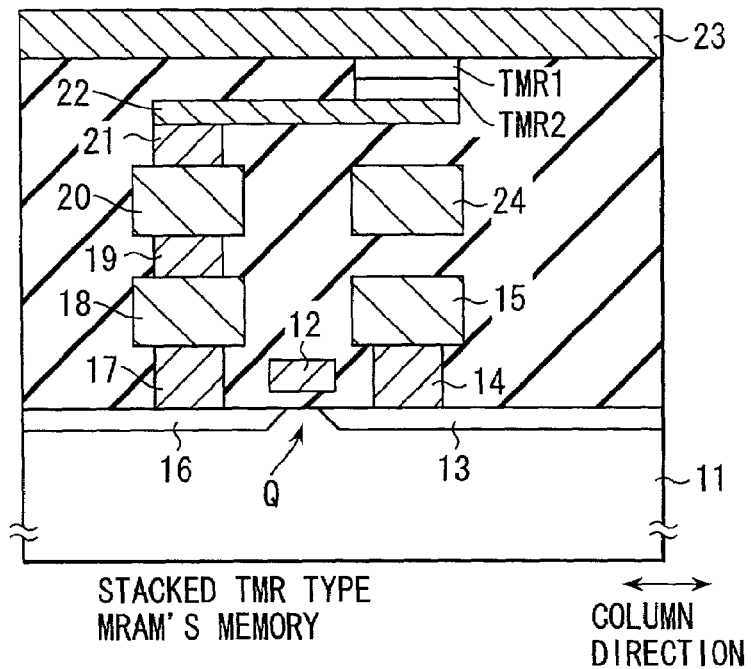
FIG. 8 is a sectional view showing an MRAM of the present invention.

FIG. 8 shows a magnetic random access memory of a first example of the present invention.

A MOS transistor Q is formed on a semiconductor substrate 11 as a switching element. The gate electrode of the MOS transistor Q serves as a read word line 12. The source diffusion layer 13 of the MOS transistor Q is connected to a source line 15 via a plug 14.

The drain diffusion layer 16 of the MOS transistor Q is connected to a TMR element via plugs 17, 19, and 21 and a wire layers 18, 20, and 22. In the case of this example, a TMR element is constituted by two TMR layers TMR1 and TMR2. The TMR element is held between the wire layer 22 and a bit line (current driving line) 23.

A current-driving line (write word line) 24 is set immediately below the TMR element. The current-driving line 24 extends in the direction (row direction) vertical to the extending direction (column direction) of the bit line 23. Data is written in the TMR element in accordance with magnetic fields generated by the current circulating through the bit line 23 and the current circulating through the current-driving line 24.

Figure 9:
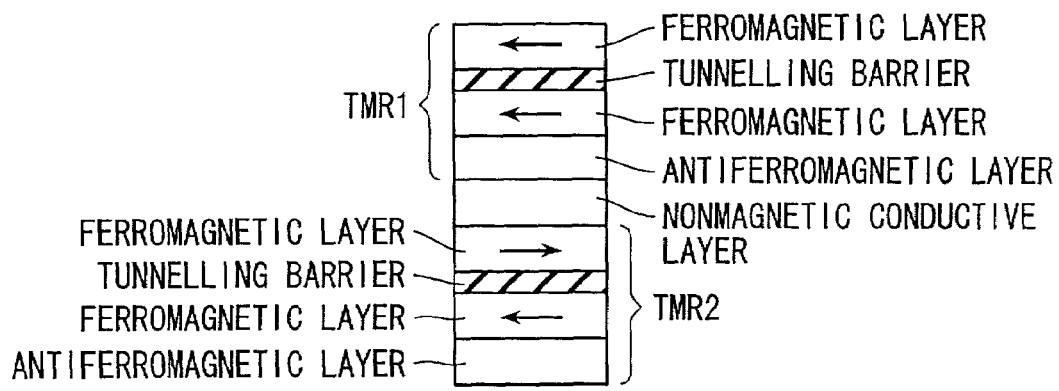
FIG. 9 is an illustration showing a TMR element of an MRAM of the present invention.

In the case of this example, as shown in FIG. 9, a TMR element has a structure (stacked TMR structure) constituted by stacking two TMR layers TMR1 and TMR2 in the longitudinal direction. In this case, a non-magnetic conductive layer is formed between these two TMR layers TMR1 and TMR2 having the same structure from the macro viewpoint.

However, as shown by the example in FIG. 10, it is also allowed to share one anti-ferromagnetic layer by two TMR layers TMR1 and TMR2 and omit a non-magnetic conductive layer.

This example is described by assuming that a TMR element is constituted by two TMR layers and data of up to four values can be stored in the TMR element. However, the present invention can be also applied to a TMR element constituted by three TMR layers or more. In this case, it is possible to store data of five values or more in one memory cell.

When using the stacked TMR structure shown in FIG. 9, the TMR layers TMR1 and TMR2 have the same structure from the macro viewpoint. However, because of a reason for the write-operation principle, asteroid curves of the TMR layers TMR1 and TMR2 are different from each other.

Figure 5:
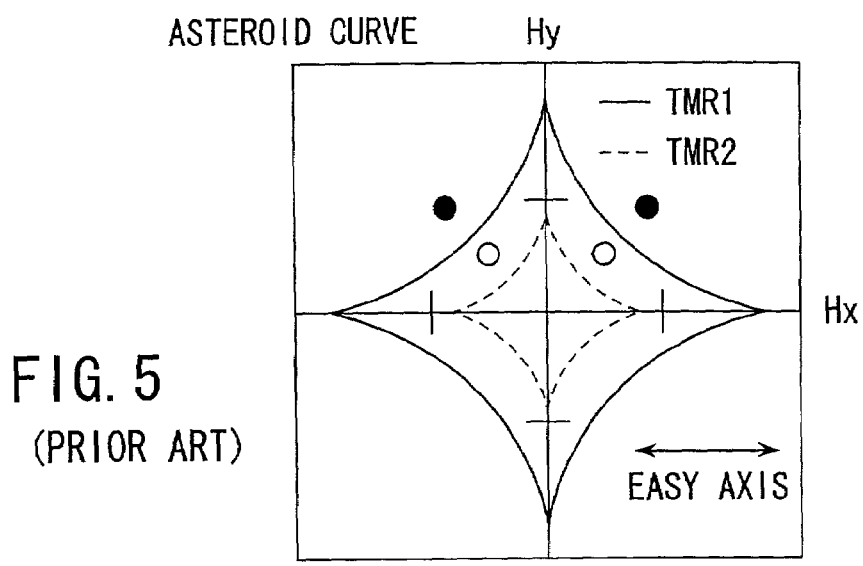
FIG. 5 is an illustration showing an asteroid curve.

For example, as shown in FIG. 5, the asteroid curve of the TMR layer TMR1 at the bit-line side becomes a curve shown by a full line and the asteroid curve of the TMR layer TMR2 at the current-driving-line (write-word-line) side becomes a curve shown by a broken line. That is, the TMR layers TMR1 and TMR2 are made different from each other in characteristic so that data can be selectively written in the TMR layer TMR1 or TMR2.

That is, the intensity of a current (or magnetic field generated by the current) circulating through the current-driving line 24 is adjusted to first write data DATA1 in the TMR layer TMR1 at the position of a black circle in FIG. 5. In this case, the data DATA1 is also written in the TMR layer TMR2.

Therefore, hereafter, the intensity of the current circulating through the current-driving line 24 (or magnetic field generated by the current) is further adjusted to write data DATA2 in the TMR layer TMR2 at the position of a white circle in FIG. 5. In this case, because the magnetic field does not have an intensity large enough to rewrite the data in the TMR layer TMR1, the data DATA1 is not overwritten in the TMR layer TMR1 but the data DATA1 is held.

Thus, because a magnetic field required to write data in the TMR layer TMR2 is smaller than a magnetic field required to write data in the TMR layer TMR1, it is possible to selectively write data in a plurality of TMR layers by successively executing the write operation from a TMR layer requiring a strong magnetic field for write toward a TMR layer only requiring a weak magnetic field.

The above example is applied to a case in which the two TMR layers TMR1 and TMR2 are present at positions having almost equal distances from the bit line 23 and current-driving line 24. That is, it is assumed that the two TMR layers TMR1 and TMR2 receive magnetic fields at the same intensity.

Moreover, the above write-operation principle assumes that intensities of magnetic fields applied to the TMR layers TMR1 and TMR2 are almost equalized and asteroid curves of the TMR layers TMR1 and TMR2 are changed. However, it is also allowed to almost equalize asteroid curves of the TMR layers TMR1 and TMR2 and change intensities of the TMR layers TMR1 and TMR2.

To change intensities of magnetic fields applied to the TMR layers TMR1 and TMR2, it is preferable to set the TMR layers TMR1 and TMR2 to positions having distances from the bit line 23 and current-driving line 24 different from each other. Also in this case, it is possible to selectively write data in a plurality of TMR layers.

FIGS. 11A, 11B and FIG. 12 specifically shows the above mentioned.

FIGS. 11A and 11B show the relationship between the distance r from the center of a cylinder having a radius "a" and the circumferential-directional magnetic-field intensity Hr.

Though the actual wire is rectangular, the change of magnetic fields to the distance from the center of the wire can be schematically approximated by the change of magnetic fields when using a cylinder-shaped wire. When performing the above approximation, the circumferential-directional magnetic-field intensity Hr is decreased inversely proportionally to the distance r from the center of the cylinder.

By using the above phenomenon (positional dependency of the magnetic field generated by a current circulating through a wire), it is possible to write data in the two TMR layers TMR1 and TMR2 separately.

FIG. 12 shows magnetic fields to be applied to the TMR layers TMR1 and TMR2 under the write operation.

For example, when assuming the longitudinal distance of the TMR layers TMR1 and TMR2 as t and writing data in the TMR layer TMR1, the influence of the magnetic field generated by a current Ix is increased and the influence of the magnetic field generated by a current Iy is decreased because the distance between a wire through which the current Iy circulates and the TMR layer TMR1 is increased due to the interval t or the thickness of the TMR layer TMR2.

Moreover, when writing data in the TMR layer TMR2, the influence of the magnetic field generated by the current Iy is increased and the influence of the magnetic field generated by the current Ix is decreased because the distance between a wire through which the current Ix circulates and the TMR layer TMR2 is increased due to the interval t or the thickness of the TMR layer TMR1.

In this case, to write data in the TMR layers TMR1 and TMR2 (to change spin directions), if the intensity of the magnetic field generated by the current Ix must be equal to the intensity of the magnetic field generated by the current Iy, the intensity of the magnetic field generated by the current Ix must be equal to the intensity of the magnetic field generated by the current Iy at the position of the TMR layer TMR1 when writing data in the TMR layer TMR1.

To realize the above mentioned, it is necessary to make the write current Iy larger than the write current Ix.

For example, as illustrated, when it is assumed that the distance between the wire through which the current Ix circulates and the TMR layer TMR1, the distance between the wire through which the current Iy circulates and the TMR layer TMR2 are t respectively, the distance between the wire through which the current Ix circulates and the TMR layer TMR1 becomes t and the distance between the wire through which the current Iy circulates and the TMR layer TMR1 becomes 2t (the thickness of a TMR element is ignored). Therefore, when assuming Iy=2×Ix in accordance with the relational expression (1) in FIG. 11, a synthetic magnetic field is brought to the position of a black circle outside of the asteroid curve in FIG. 5 and it is possible to write data in the TMR layer TMR1.

In this case, by bringing the synthetic magnetic field to a position inside of the asteroid curve for the TMR layer TMR2, data is not written in the TMR layer TMR2.

Similarly, to write data in the TMR layer TMR2, it is allowed to make Ix equal to 2×Iy and bring the synthetic magnetic field to the position of a black circle outside of the asteroid curve in FIG. 5. However, in the case of this example, it is assumed that asteroid curves of the TMR layers TMR1 and TMR2 are the same.

Then, a method (read-operation principle) is described in which resistance values of the TMR layers TMR1 and TMR2, that is, the data stored in the TMR layer TMR1 and the data stored in the TMR layer TMR2 are independently detected when a TMR element constituting a memory cell is constituted by two TMR layers TMR1 and TMR2 connected in series.

FIG. 13 shows junction area dependencies of the MR ratio (%) and the resistance R (Ω) of a TMR layer.

As shown in FIG. 13, the MR ratio does not depend on the junction area (full line) but the resistance value R depends on the junction area and changes depending on the thickness of an insulating layer serving as a tunneling barrier (in this case, thickness of AlOx) (broken line).

In this case, the specific read-operation principle is described below by assuming that MR ratios of the TMR layers TMR1 and TMR2 are 50% respectively and the resistance value of the TMR layer TMR1 is two times larger than that of the TMR layer TMR2 when magnetized states of them are the same.

The above condition can be realized by making the thickness of the tunneling barrier of the TMR layer TMR2 smaller than that of the tunneling barrier of the TMR layer TMR1 and the junction area of the TMR layer TMR2 larger than that of the TMR layer TMR1.

In this case, it is possible to simplify an equivalent circuit of a detection circuit for detecting resistance values of the TMR layers TMR1 and TMR2 as shown in FIG. 14.

Because the TMR layers TMR1 and TMR2 can respectively take two states (high resistance value High and low resistance value Low) in accordance with a magnetized state, resistance values $R_{TMR1}$ and $R_{TMR2}$ of the TMR layers TMR1 and TMR2 have values shown in Table 1 in accordance with a magnetized state.

TABLE 1

DETECTION OF 4-LEVEL DATA

|  | RTMR1 | RTMR2 |
|---|---|---|
| High resistance value | 4 | 2 |
| Low resistance value | 2 | 1 |

Vo = (Rs · V)/(Rs + RTMR1 + RTMR2)
Where V = 1, Rs = 4,
VLL = 4/(4 + 2 + 1) = 0.57
VLH = 4/(4 + 2 + 2) = 0.5
VHL = 4/(4 + 4 + 1) = 0.44
VHH = 4/(4 + 4 + 2) = 0.4
VLL − VLH = 0.07
VLH − VHL = 0.06
VHL − VHH = 0.04

That is, the resistance values $R_{TMR1}$ of the TMR layer TMR1 becomes "2" or "4" and the resistance value $R_{TMR2}$ of the TMR layer TMR2 becomes "1" or "2". Moreover, the resistance value of a detection resistance Rs is assumed as "4".

In this case, the following four combinations between the resistance values $R_{TMR1}$ and $R_{TMR2}$ of the TMR layers TMR1 and TMR2 are considered in accordance with magnetized states (correspond to data "0" and data "1") of the TMR layers TMR1 and TMR2: mt;epmac;01acx; mx $R_{TMR1}$=2 (Low) and $T_{RMR2}$=1 (Low), mt;epmac;02acx; mx $R_{TMR1}$=2 (Low) and $R_{TMR2}$=2 (High), 3 $R_{TMR1}$=4 (High) and $R_{TMR2}$=1 (Low), and mt;epmac;04acx; mx $R_{TMR1}$=4 (High) and $R_{TMR2}$=2 (High).

When assuming detection voltages Vo corresponding to the above four cases as VLL, VLH, VHL, and VHH, and assuming a read voltage Vo as 1V, VLL becomes equal to 0.57 V, VLH becomes equal to 0.5 V, VHL becomes equal to 0.44 V, and VHH becomes equal to 0.4 V.

Moreover, differences between the detection voltages are VLL−VLH=70 mV, VLH−VHL=60 mV, and VHL−VHH=40 mV. When there are these differences, it is possible to detect the detection voltages (four-value data).

When assuming that the resistance value of a detection resistance Ro is a value as close to the average (average resistance value) of total values (four cases) of the resistance values $R_{TMR1}$ and $R_{TMR2}$ of the TMR layers TMR1 and TMR2 as possible, it is possible to obtain a maximum detection voltage.

The above write-operation principle and read-operation principle are described for write and read of four-level data by using two TMR layers connected in series. However, it is also possible to write or read data of 5-value level or higher by increasing the number of TMR layers connected in series to 3, 4, 5, . . .

Figure 15:
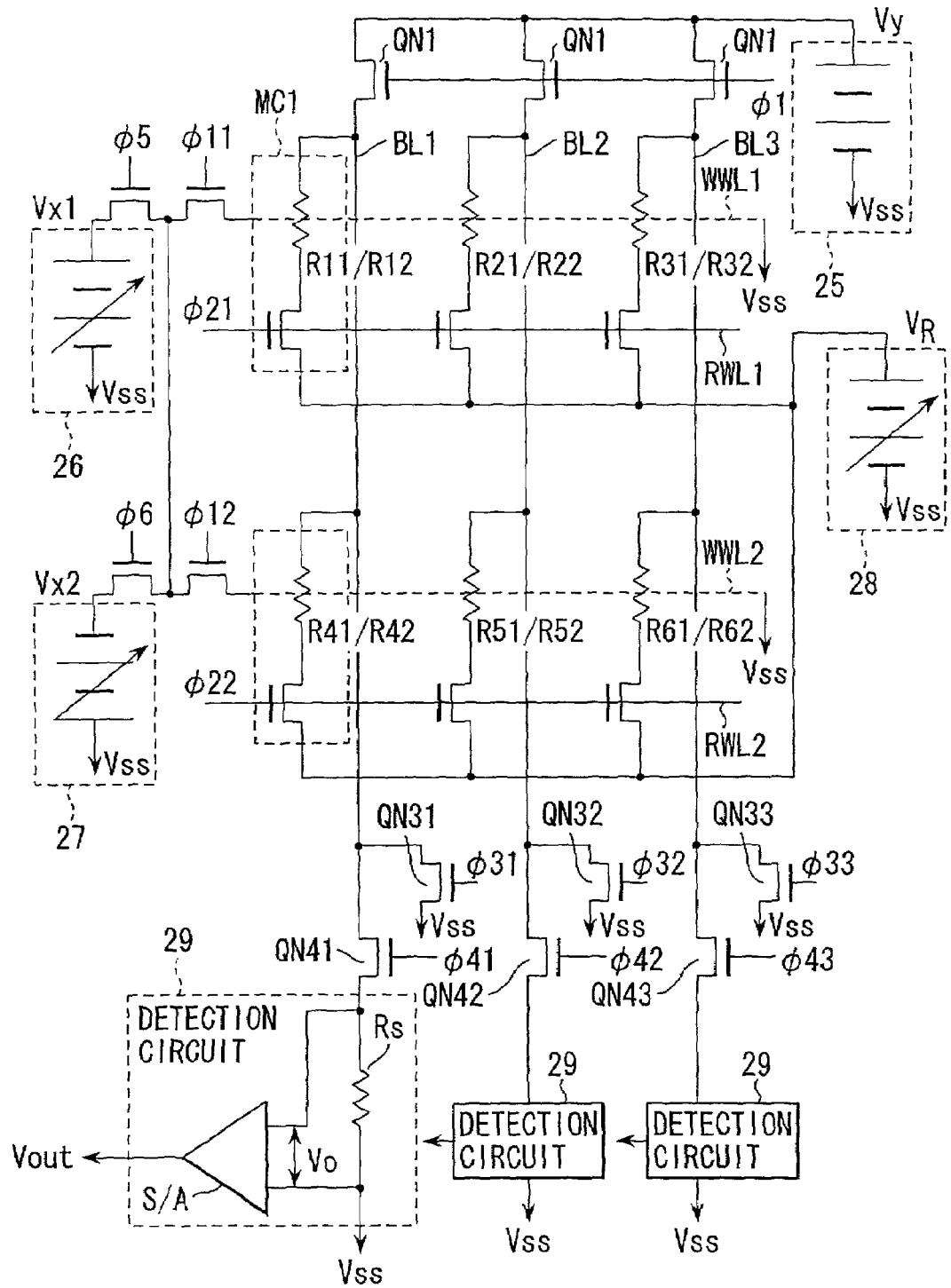
FIG. 15 is a circuit diagram showing an essential portion of an MRAM of the present invention.

FIG. 15 shows a circuit configuration of the memory-cell array section of a magnetic random access memory of the present invention.

Control signals φ1, φ31, φ32, and φ33 controls on/off of N-channel MOS transistors QN1, QN31, QN32, and QN33 to determine whether to supply current to bit lines BL1, BL2, and BL3. A current-driving power-source 25 is connected to ends (N-channel MOS transistor-QN1 side) of the bit lines BL1, BL2, and BL3. The current-driving power-source line 25 supplies a power-source potential Vy to the bit lines BL1, BL2, and BL3.

The N-channel MOS transistors QN31, QN32, and QN33 are connected between the other ends of the bit lines BL1, BL2, and BL3 and a ground point.

Moreover, the control signal φ1 becomes "H"-level and one of the control signals φ31, φ32, and φ33 becomes "H"-level under the write operation. For example, when writing data in the TMR element (TMR layer TMR1) of a memory cell MC1, a current circulates through the bit line BL1 because the control signals φ1 and φ31 become "H"-level as shown by the timing chart in FIG. 16. In this case, control signals φ41, φ42, and φ43 are kept at "L" level.

Moreover, Vx1 is a current-driving power-source potential for "1"-write and Vx2 is a current-driving power-source potential for "0"-write.

Figure 16:
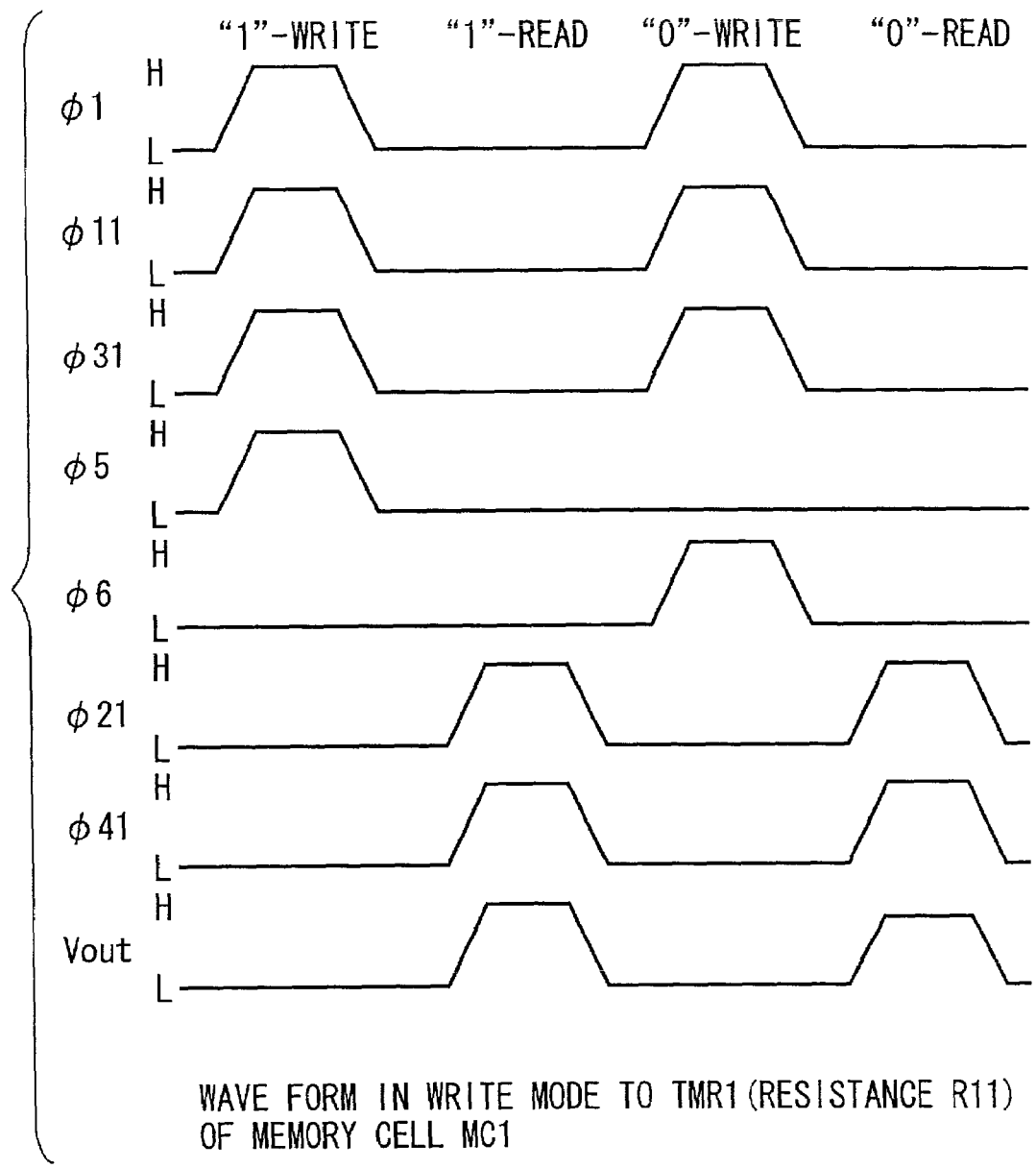
FIG. 16 is an illustration showing an operational waveform of the memory in FIG. 15.

For example, as shown in FIG. 16, control signals φ5 and φ11 become "H"-level under "1"-write. In this case, control signals φ6 and φ12 are kept at "L" level. Therefore, a current circulates through a write word line WWL1 from left to right (from current-driving power-source 26 to ground point). Therefore, "1"-data is written in the TMR element (TMR layer TMR1) of the memory cell MC1 set at the intersection between the bit line BL1 and the write word line WWL1.

Moreover, as shown in FIG. 16, the control signals φ6 and φ11 become "H"-level under "0"-write. In this case, the control signals φ5 and φ12 are kept at "L" level. Therefore, a current circulates through the write word line WWL1 from right to left (from ground point to current-driving power source 27). Therefore, "0"-data is written in the TMR element (TMR layer TMR1) of the memory cell C1 set at the intersection between the bit line BL1 and the write word line WWL1.

Thus, the control signal φ1 is used to supply a driving current to a bit line and the control signals φ31, φ32, and φ33 are used to decide a bit line to which a driving current will be supplied (in the case of this example, the direction of a driving current circulating through a bit line is constant). Moreover, the control signals φ5 and φ6 control the direction of a current circulating through a write word line (corresponding to write data for this example) and the control signals φ11 and φ12 decide a write word line to which a driving current will be supplied.

In the case of this example, a memory cell array of 3×2 is assumed to simplify description. In this case, a memory cell (specifically, a TMR element constituted by two TMR layers TMR1 and TMR2) is set to intersections between write word lines WWL1 and WWL2 on one hand and bit lines BL1, BL2, and BL3 on the other respectively.

In this case, to read data from the memory cell (TMR element) MC1, control signals φ21, φ22, φ41, φ42, and φ43 are controlled as described below.

That is, under the read operation, the control signal φ21 to be supplied to a read word line RWL1 is set to "H" level and an N-channel MOS transistor connected to the read word line RWL1 is turned on. In this case, the control signal φ22 to be supplied to other read word line RLLW2 is kept at "L" level.

Moreover, by setting the control signal φ41 to "H" level and other control signals φ42 and φ43 to "L" level, a driving current flows toward a ground point from a read power source 28 via the memory cell MC1 (N-channel MOS transistor and TMR element), bit line BL1, N-channel MOS transistor QN41, and detection resistance Rs.

That is, in accordance with the read operation principle shown in FIG. 14, a detection voltage Vo corresponding to the data value in the memory cell MC1 is generated at the both ends of the detection resistance Rs. By detecting the detection voltage Vo by a sense amplifier S/A, it is possible to read data from a memory cell (TMR element).

Figure 17:
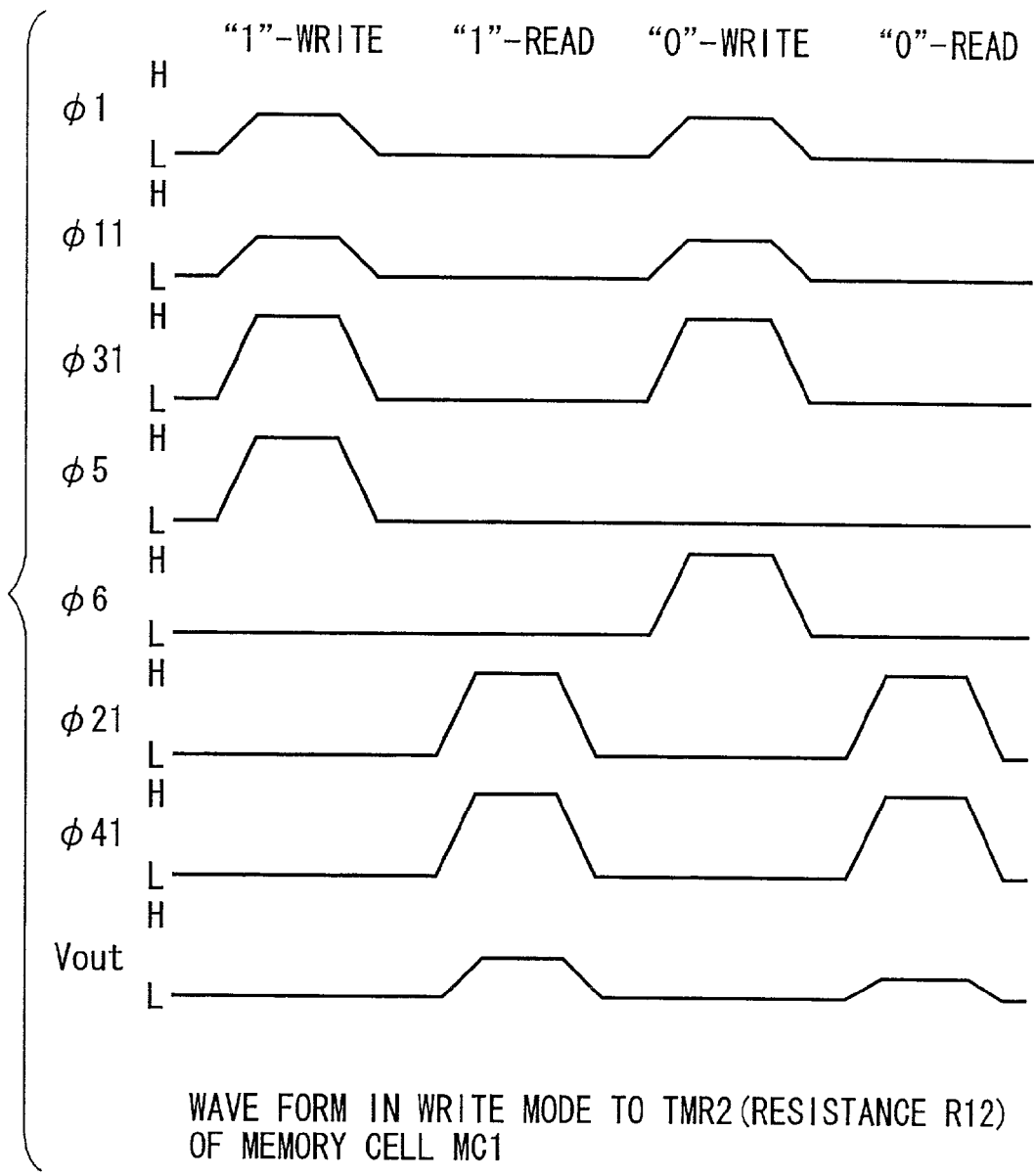
FIG. 17 is an illustration showing an operational waveform of the memory in FIG. 15.

FIGS. 16 and 17 show waveforms in the write mode to the memory cell MC1 in FIG. 15.

In this case, it is assumed that the memory cell MC1 has two TMR layers TMR1 and TMR2 connected in series and the TMR layers TMR1 and TMR2 have asteroid curves shown in FIG. 5.

First, write of data to the TMR layer TMR1 is executed (FIG. 16).

A rightward or leftward current is supplied to the write word line WWL1 by setting the control signals φ1 and φ31 to "H" level, supplying a current to the bit line BL1, setting the control signals φ5 and φ11 to "H" level under "1"-write, and setting the control signals φ6 and φ11 to "H" level under "0"-write.

Then, a synthetic magnetic field generated by the current circulating through the write word line WWL1 and bit line BL1 is applied to the TMR element of the memory cell MC1. In this case, the synthetic magnetic field is set so as to be brought to the outside of the asteroid curve (full line in FIG. 5) of the TMR layer TMR1 such as the position of a black circle.

As a result, predetermined data is written in the TMR layer TMR1 of the memory cell MC1.

Then, data write to the TMR layer TMR2 is executed (FIG. 17).

The data write operation to the TMR layer TMR2 is different from the data write operation to the TMR layer TMR1 in that "H" levels of the control signals φ1 and φ11 are ½ the "H" levels of the control signals φ1 and φ11 for the data write operation to the TMR layer TMR1.

In this case, a synthetic magnetic field generated by the current circulating through the write word line WWL1 and bit line BL1 is brought to the outside of the asteroid curve (broken line in FIG. 5) of the TMR layer TMR2 and the inside of the asteroid curve (full line in FIG. 5) of the TMR layer TMR1, such as the position of a while circle by setting the control signals φ6 and φ11 to "H" level, supplying a rightward or leftward current to the write word line WWL1, and applying the synthetic magnetic field to the TMR element of the memory cell MC1.

As a result, predetermined data is written in the TMR layer TMR2 of the memory cell MC1. In this case, because the magnetized state (data) of the TMR layer TMR1 of the memory cell MC1 is not changed, the data in the TMR layer TMR1 in which data is already written is not broken.

Thus, when the TMR layers TMR1 and TMR2 have the asteroid curves shown in FIG. 5, it is possible to selectively write data in the TMR layers TMR1 and TMR2. Moreover, under read, four types of detection voltages Vo corresponding to magnetized states ("1" or "0") the TMR layers TMR1 and TMR2 are converted into four voltage levels Vout by the sense amplifier S/A. Moreover, by comparing the four voltage levels Vout with a reference voltage, it is possible to convert the voltage levels Vout into two-bit data.

In the case of this example, it is assumed that a TMR element in one memory cell is constituted by two TMR layers TMR1 and TMR2 and asteroid curves of the two TMR layers TMR1 and TMR2 are different from each other. As described for FIG. 12, however, also when using two TMR layers having the same asteroid curve, the same advantage can be obtained by changing relative positions of these two TMR layers and making intensities of magnetic fields applied to these two TMR layers different from each other. In this case, by adjusting a write current, it is possible to execute the write operation from any side of the two TMR layers.

Then, a device structure and its fabrication method of the magnetic random access memory of this example are described below.

Figure 18:
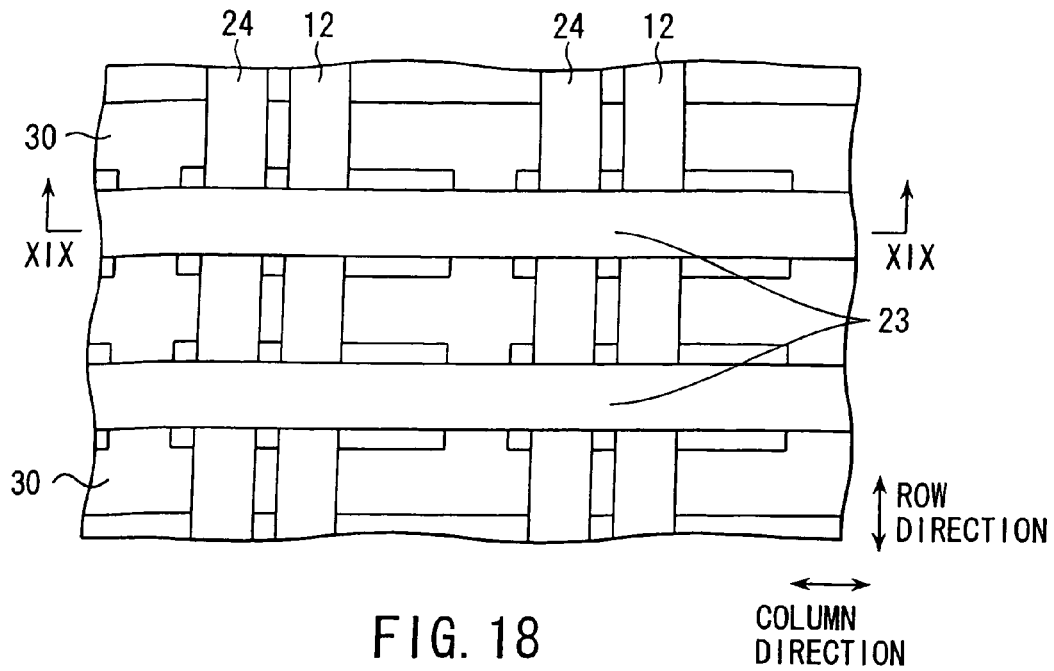
FIG. 18 is a top view showing a device structure of an MRAM of the present invention.
Figure 19:
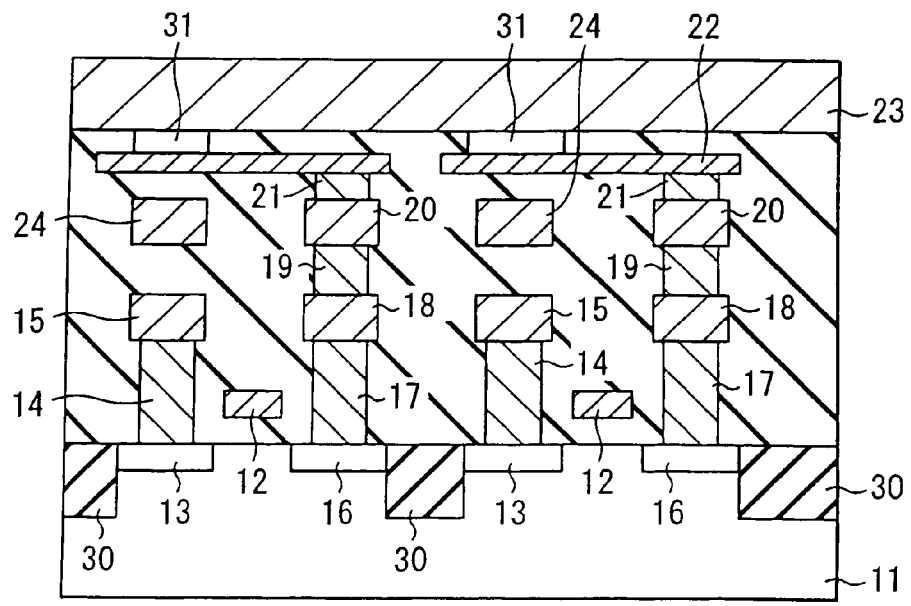
FIG. 19 is a sectional view along the line XIX—XIX in FIG. 18.

FIGS. 18 and 19 show a device structure of the magnetic random access memory of the first example of the present invention.

It can be considered that the magnetic random access memory shows the magnetic random access memory described for FIG. 8 in detail. In FIGS. 18 and 19, a portion same as that in FIG. 8 is provided with the same symbol.

An element separation layer 30 having an STI (Shallow Trench Isolation) structure is set in a semiconductor substrate 11. The element separation layer 30 electrically separates a plurality of element areas from each other. In the case of this example, the element separation layer 30 has the STI structure. However, it is allowed to use other structure (such as LOCOS structure).

A MOS transistor serving as a switching element is formed in an element area on the semiconductor substrate 11. The gate electrode of the MOS transistor serves as a read word line 12. The source diffusion layer 13 of the MOS transistor is connected to a source line (ground line) 15 via a plug 14.

The drain layer 16 of the MOS transistor is connected to a stacked TMR element 31 via plugs 17, 19, and 21 and wire layers 18, 20, and 22.

The plug 17 is constituted by, for example, a conductive polysilicon film containing an impurity or a metallic film and the plugs 19 and 21 and the wire layers 18, 20, and 22 are respectively constituted by a metallic film made of aluminum or copper.

The TMR element 31 is constituted by stacked layers. The stacked TMR element 31 has a structure as shown in FIGS. 9 and 10. The TMR element 31 is held between the wire layer (local-interconnection wire) 22 and a bit line 23.

The current-driving line 24 is set immediately below the TMR element 31. The current-driving line 24 extends in the direction (row direction) vertical to the direction (column direction) in which the bit line 23 extends. Data is written in the TMR element 31 by magnetic fields generated by the current circulating through the bit line 23 and the current circulating through the current-driving line 24.

Then, the fabrication method of the magnetic random access memory in FIG. 18 and 19 is described below.

Figure 20:
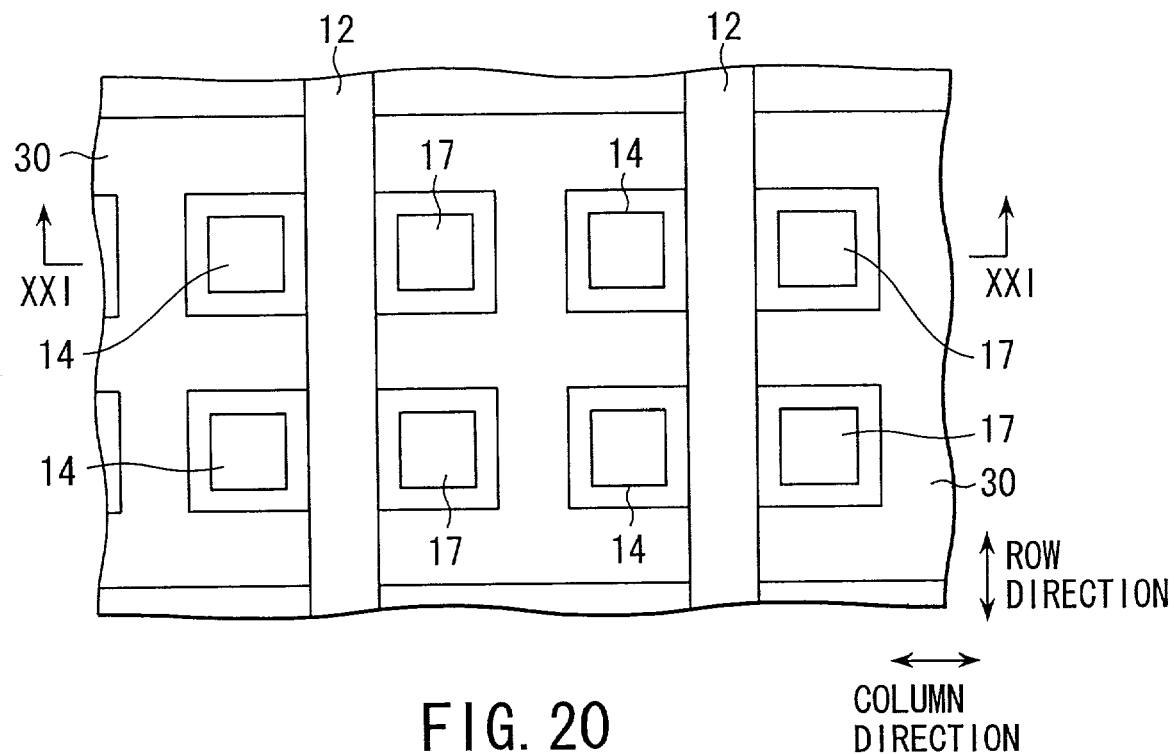
FIG. 20 is a top view showing one step of the MRAM fabrication method in FIGS. 18 and 19.
Figure 21:
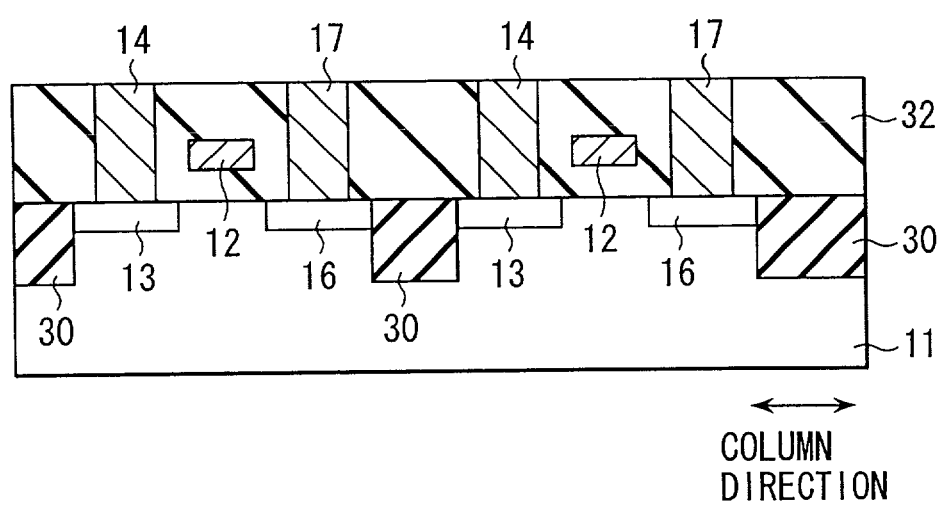
FIG. 21 is a sectional view along the line XXI—XXI in FIG. 20.

First, as shown in FIGS. 20 and 21, the element separation layer 30 having the STI structure is formed in the semiconductor substrate 11 by publicly-known methods such as PEP (Photo Engraving Process), CVD (Chemical Vapor Deposition), and CMP (Chemical Mechanical Polishing).

Moreover, a MOS transistor is formed in an element area surrounded by the element separation layer 30. Then, an insulating layer 32 for completely covering the MOS transistor is formed by CVD. A contact hole reaching the source diffusion layer 13 and drain diffusion layer 16 of the MOS transistor is formed in the insulating layer 32 by PEP and RIE (Reactive Ion Etching).

Furthermore, a conductive material (such as a conductive polysilicon film containing an impurity or metallic film) completely filling the contact hole is formed in the insulating layer 32. Then, the conductive material is polished by CMP to form contact plugs 14 and 17.

Figure 22:
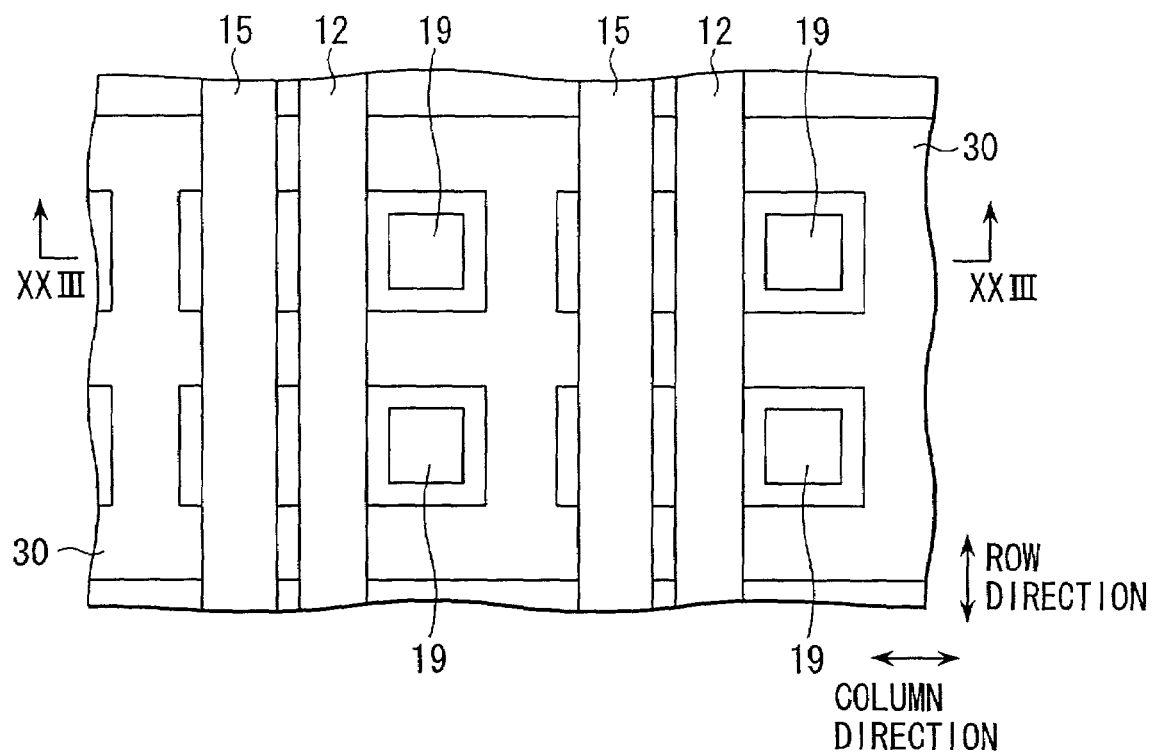
FIG. 22 is a top view showing one step of the MRAM fabrication method in FIGS. 18 and 19.
Figure 23:
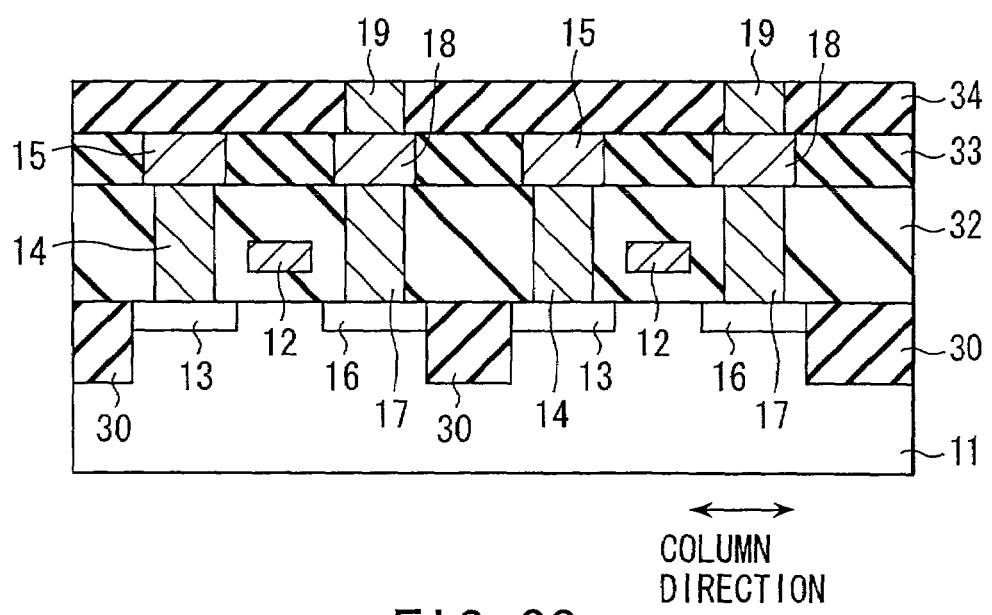
FIG. 23 is a sectional view along the line XXIII—XXIII in FIG. 22.

Then, as shown in FIGS. 22 and 23, an insulating layer 33 is formed on the insulating layer 32 by CVD. A wire groove is formed in the insulating layer 33 by PEP and RIE. A conductive material (such as a metallic film made of aluminum or copper) completely filling the wire groove is formed on the insulating layer 33 by sputtering. Then, the conductive material is polished by CMP to form wires 15 and 18.

The wire 15 functions as a source line (ground line).

Then, an insulating layer 34 is formed on the insulating layer 33 by CVD. A via hole is formed in the insulating layer 34 by PEP and RIE. A conductive material (such as a metallic film made of aluminum or copper) completely filling the via hole is formed on the insulating layer 34 by sputtering. Then, the conductive material is polished by CMP to form a plug 19.

Figure 24:
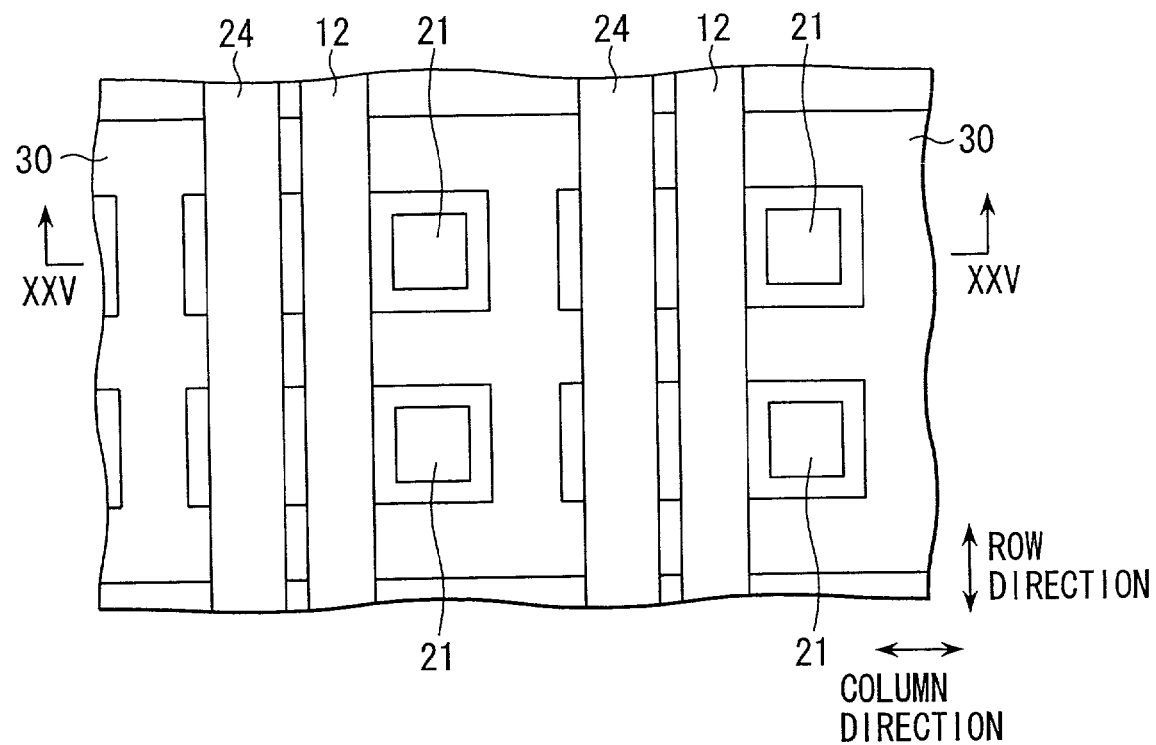
FIG. 24 is a top view showing one step of the MRAM fabrication method in FIGS. 18 and 19.
Figure 25:
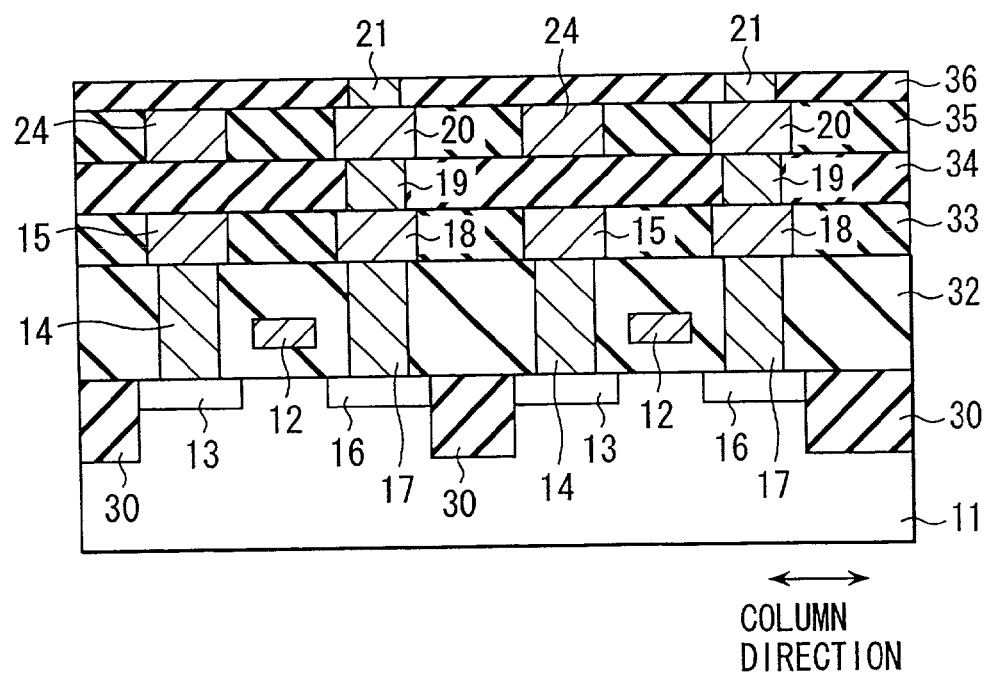
FIG. 25 is a sectional view along the line XXV—XXV in FIG. 24.

Then, as shown in FIGS. 24 and 25, an insulating layer 35 is formed on the insulating layer 34 by CVD. A wire groove is formed in the insulating layer 35 by PEP and RIE. A conductive material (such as a metallic film made of aluminum or copper) completely filling the wire groove is formed on the insulating layer 35 by sputtering. Then, the conductive material is polished by CMP to form wires 20 and 24.

The wire 24 functions as a current-driving line for supplying a current for generating a magnetic field under the write operation.

Then, an insulating layer 36 is formed on the insulating layer 35 by CVD. A via hole is formed in the insulating layer 36 by PEP and RIE. A conductive material (such as a metallic film made of aluminum or copper) completely filling the via hole is formed on the insulating layer 36 by sputtering. Then, the conductive material is polished by CMP to form a plug 21.

In this case, the thickness of the insulating layer 36 (or height of plug 21) decides the distance between the wire (current-driving line) 24 and a TMR element. Because the intensity of a magnetic field decreases inversely proportionally to a distance as described above, it is preferable to make the TMR element approach the wire (current-driving line) 24 as near as possible so that data can be rewritten by a small driving current. Therefore, the thickness of the insulating layer 36 is made as small as possible.

Figure 26:
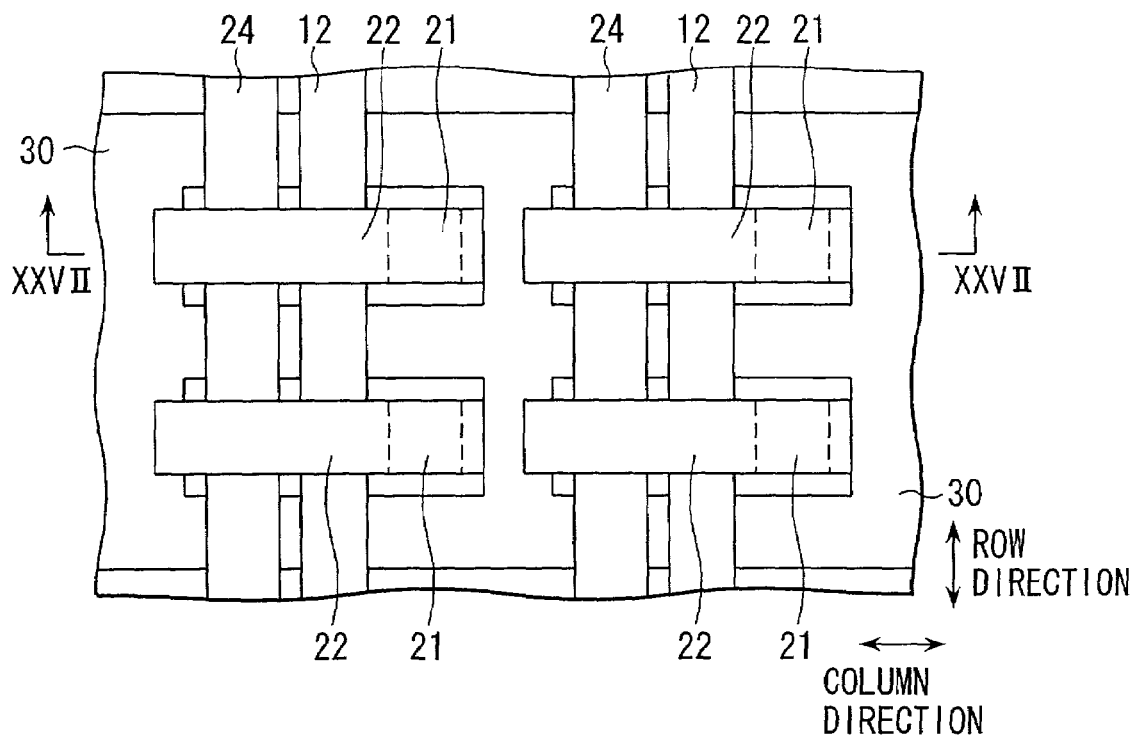
FIG. 26 is a top view showing one step of the MRAM fabrication method in FIGS. 18 and 19.
Figure 27:
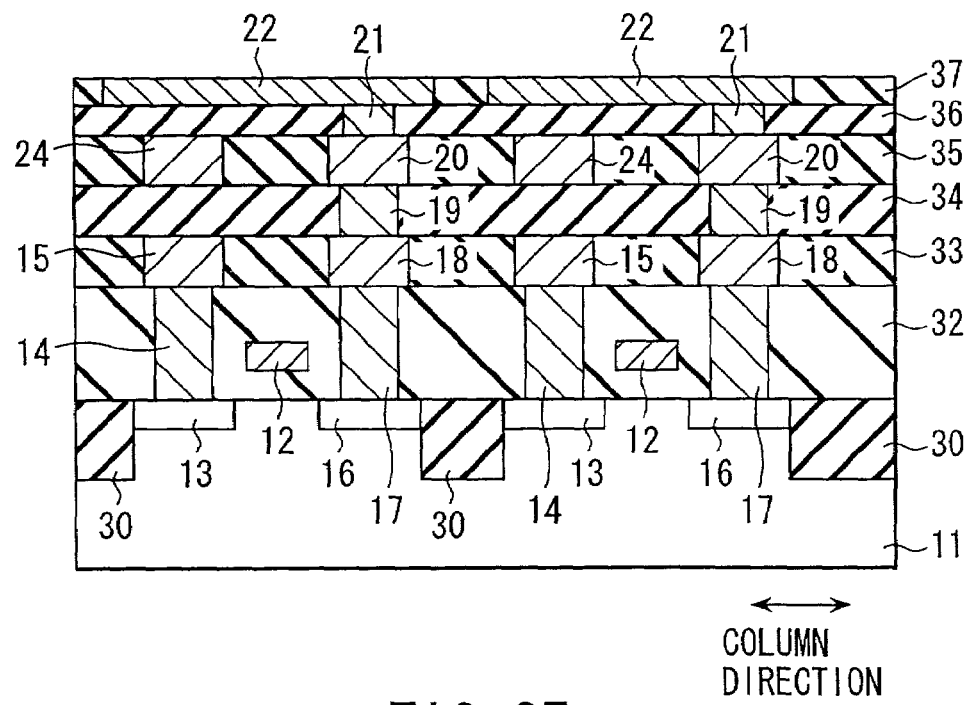
FIG. 27 is a sectional view along the line XXVII—XXVII in FIG. 26.

Then, as shown in FIGS. 26 and 27, an insulating layer 37 is formed on the insulating layer 36 by CVD. A wire groove is formed in the insulating layer 37 by PEP and RIE. A conductive material (such as a metallic film made of aluminum or copper) completely filling the wire groove is formed on the insulating layer 37 by sputtering. Then, the conductive material is polished by CMP to form a wire (local-interconnection wire) 22.

Figure 28:
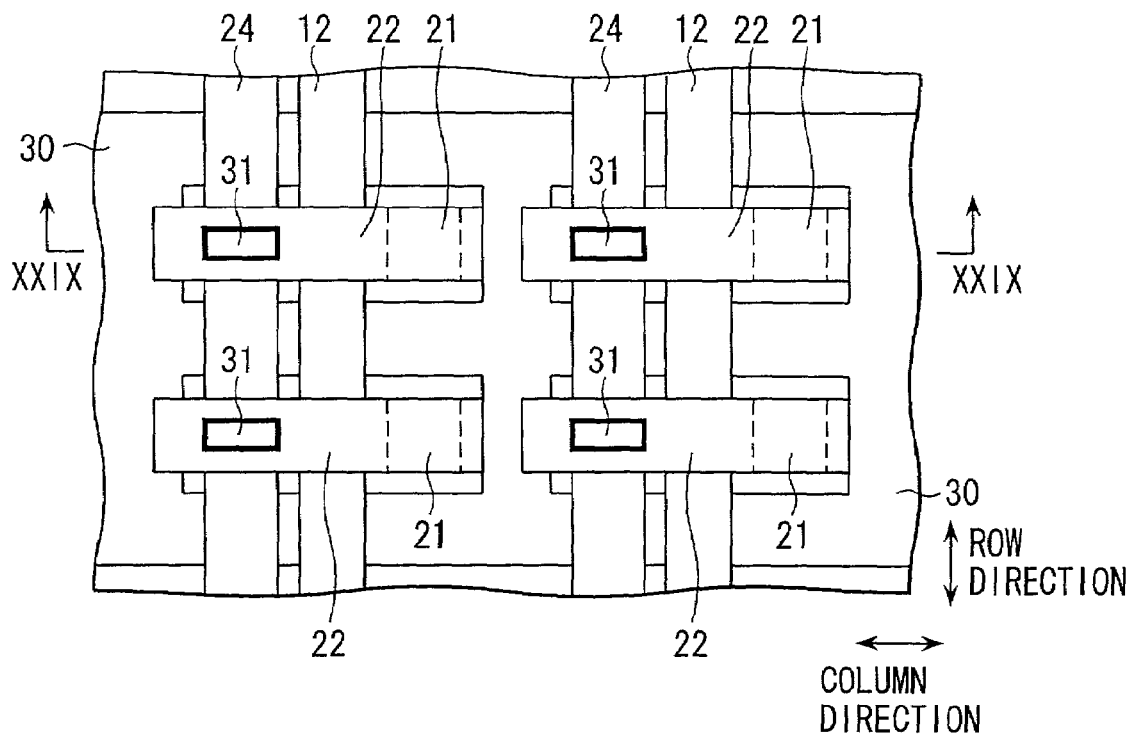
FIG. 28 is a top view showing one step of the MRAM fabrication method in FIGS. 18 and 19.
Figure 29:
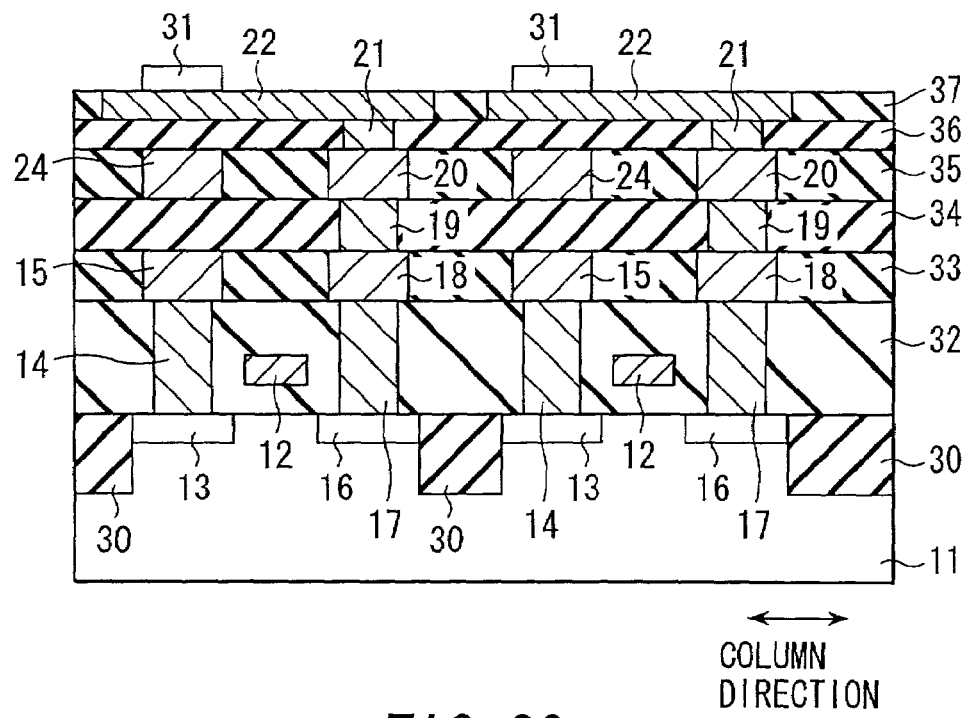
FIG. 29 is a sectional view along the line XXIX—XXIX in FIG. 28.

Then, as shown in FIGS. 28 and 29, a laminated film constituted by an anti-ferromagnetic layer, a ferromagnetic layer, tunneling barrier, and a non-ferromagnetic layer is formed by CVD. The laminated film is patterned to form a stacked TMR element 31.

Figure 30:
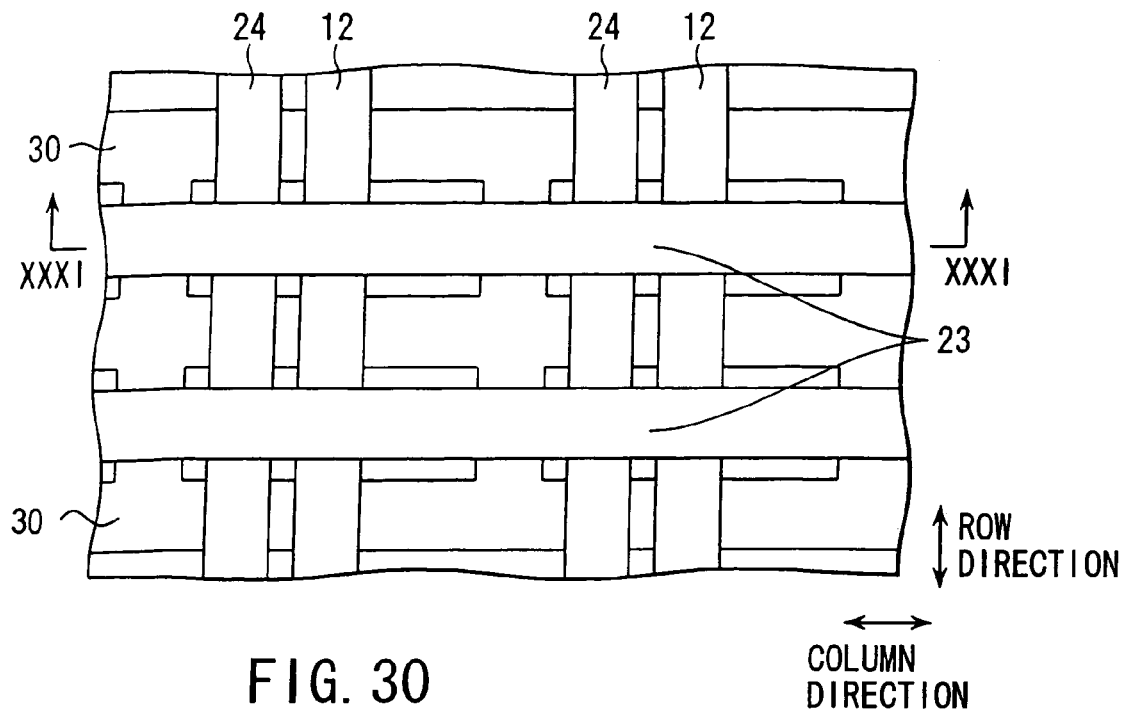
FIG. 30 is a top view showing one step of the MRAM fabrication method in FIGS. 18 and 19.
Figure 31:
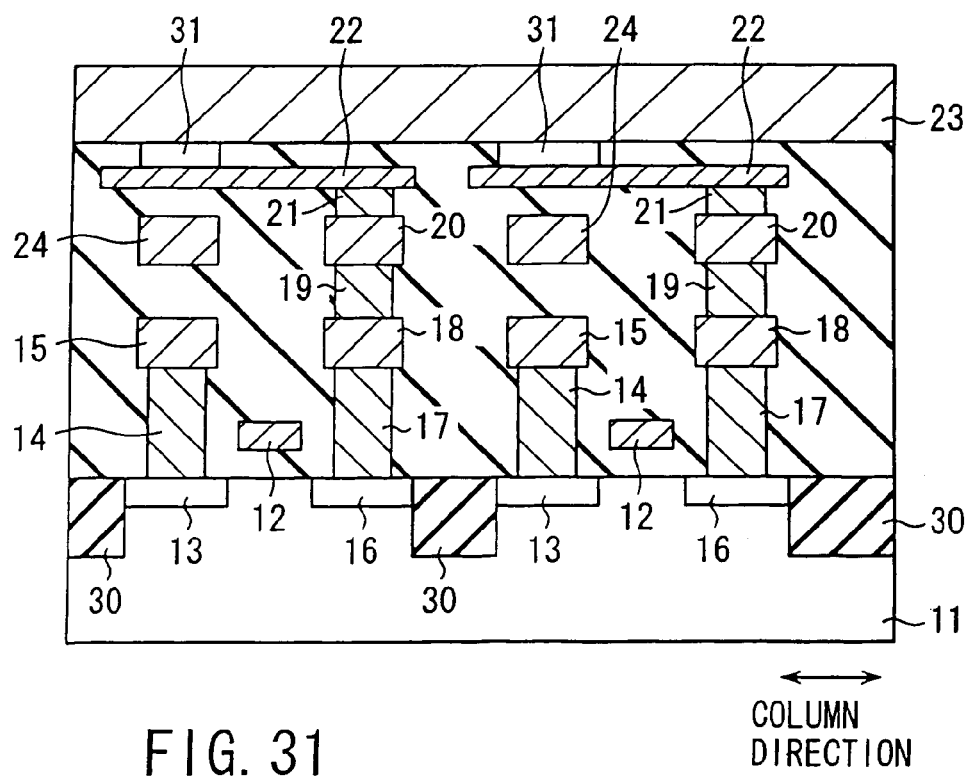
FIG. 31 is a sectional view along the line XXXI—XXXI in FIG. 30.

Then, as shown in FIG. 30 and 31, an insulating layer for covering the TMR element 31 is formed by CVD and then the insulating layer is removed from the TMR element 31 by CMP to form an insulating film for covering side faces of the TMR element 31. Moreover, the bit line (current-driving line) 23 contacting the TMR element 31 and orthogonal to the read word line 12 is formed by forming a conductive layer by sputtering and etching the conductive layer.

The magnetic random access memory in FIGS. 18 and 19 is completed in accordance with the above steps.

SECOND EXAMPLE

Figure 32:
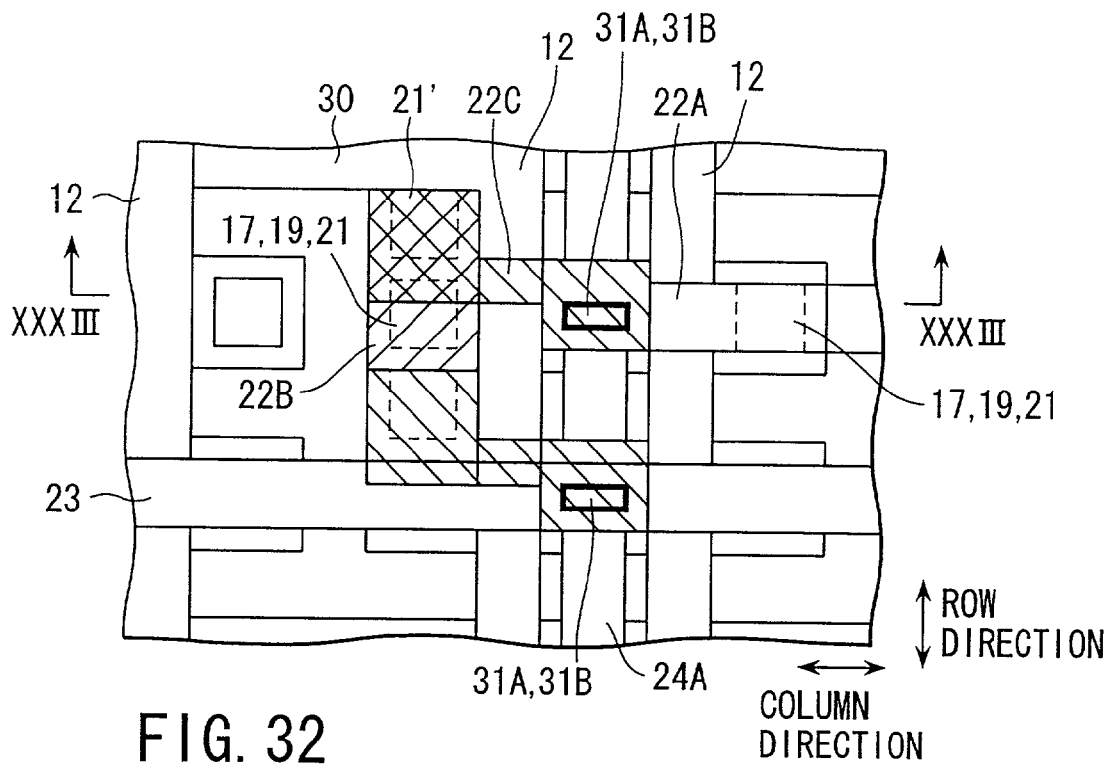
FIG. 32 is a top view showing a device structure of another MRAM of the present invention.
Figure 33:
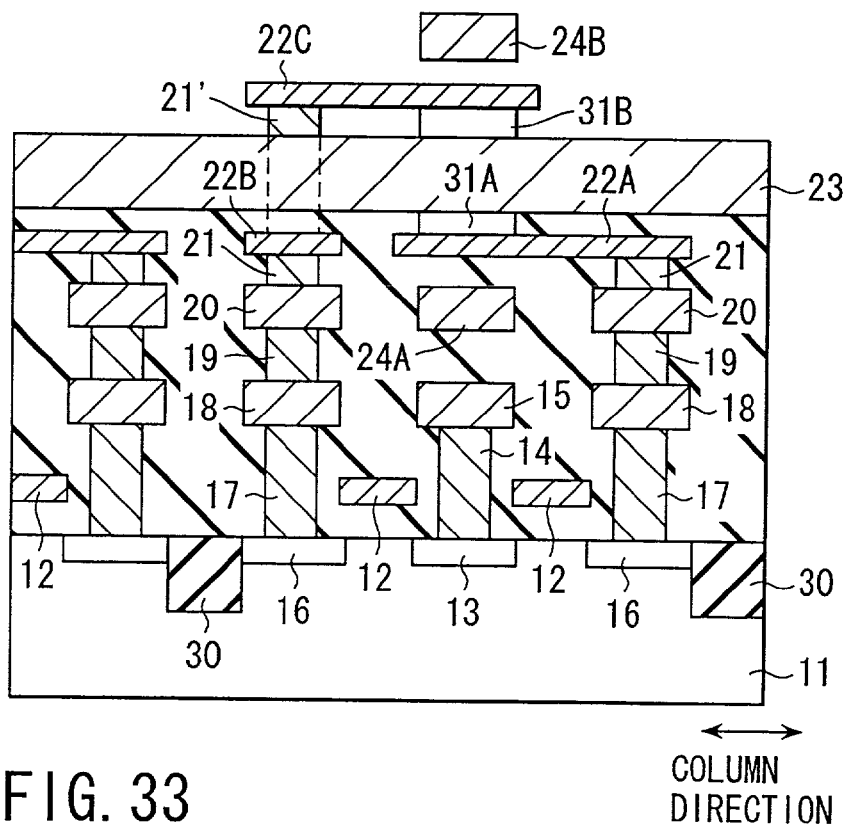
FIG. 33 is a sectional view along the line XXXIII—XXXIII in FIG. 32.

FIG. 32 is a top view showing the magnetic random access memory of a second example of the present invention. FIG. 33 is a sectional view along the line XXXIII—XXXIII in FIG. 32.

The device structure of this example has features that firstly, a TMR element is set to the upper and lower sides of a common bit line 23 respectively and secondly, two memory cells adjacent to each other in the column direction use one source diffusion layer 13 and one source line 15 in common. An advantage of reduction of a memory-cell area can be obtained from any one of these two features.

An element separation layer 30 having an STI (Shallow Trench Isolation) structure is formed in a semiconductor substrate 11. The element separation layer 30 electrically separates a plurality of element areas from each other. In the case of this example, though the element separation layer 30 uses the STI structure, it is also allowed to use other structure (such as LOCOS structure).

A MOS transistor is formed in an element area on the semiconductor substrate 11 as a switching element. The gate electrode of the MOS transistor serves as a read word line 12. In the case of this example, two MOS transistors are arranged in one element area. Moreover, these two MOS transistors use one source diffusion layer 13 in common.

Moreover, the source diffusion layer of the MOS transistor is connected to a source line (ground line) 15 via a plug 14. That is, in the case of this example, two memory cells adjacent to each other in the column direction use one source diffusion layer 13 and one source line 15 in common.

The drain diffusion layer 16 of one of the two MOS transistors using the source diffusion layer 13 in common is connected to a TMR element 31A via plugs 17, 19, and 21 and wire layers 18, 20, and 22A.

The plug 17 is constituted by, for example, a conductive polysilicon film containing an impurity or a metallic film and the plugs 19 and 21 and the wire layers 18, 20, and 22A are respectively constituted by a metallic film made of aluminum or copper. Moreover, it is allowed to use the stacked TMR element shown in FIG. 9 or 10 or the normal TMR element shown in FIG. 1 as the TMR element 31.

The TMR element 31A is set between the wire layer (local interconnection wire) 22A and the lower face of a common bit line 23.

A current-driving line 24A is set immediately below the TMR element 31A. The current-driving line 24A extends in the direction (row direction) vertical to the direction (column direction) in which the common bit line 23 extends.

Data is written in the TMR element 31A by magnetic fields generated by the current circulating through the common bit line 23 and the current circulating through the current-driving line 24A.

The drain diffusion layer 16 of the other of the two MOS transistors using the source diffusion layer 13 in common is connected to a TMR element 31B via the plugs 17, 19, 21, and a plug 21' and the wire layers 18 and 20 and wire layers 22B and 22C.

The plug 17 is constituted by a conductive polysilicon film containing an impurity or a metallic film and the plugs 19, 21, and 21' and the wire layers 18, 20, 22B, and 22C are respectively constituted by a metallic film made of aluminum or copper. Moreover, it is allowed to use the stacked TMR element shown in FIG. 9 or 10 or the normal TMR element shown in FIG. 1 as the TMR element 31B.

The TMR element 31B is set between the wire layer (local interconnection line) 22C and the upper face of the common bit line 23.

A current-driving line 24B is set immediately above the TMR element 31B. The current-driving line 24B extends in the direction (row direction) vertical to the direction (column direction) in which the common bit line 23 extends. Data is written in the TMR element 31B by magnetic fields generated by the current circulating through the common bit line 23 and the current circulating through the current-driving line 24B.

In the case of this example, the TMR elements 31A and 31B are overlapped (superimposed) each other when viewed from the upper portion of the semiconductor substrate 11. However, it is also allowed to set the elements 31A and 31B to positions at which they are overlapped each other or they are not overlapped at all.

Thus, in the case of the structure of this example, a TMR element is set to the upper and lower sides of the common bit line 23 respectively. In this case, it is possible to use the structure same as the device structure of the above first example for the TMR element set to the lower side of the common bit line 23 and the wire and plug for connecting the TMR element with the drain diffusion layer 16.

However, it is necessary to improve patterns of the wires (local interconnection wires) 22B and 22C for the TMR element set on the upper face of the common bit line 23 and the wire and plug for connecting the TMR element with the drain diffusion layer 16 so that the common bit line 23 does not connect with the plug 21'. In short, it is only necessary to shift the position of the plug 21' by using the wires 22B and 22C so that the plug 21' does not overlap with the common bit line 23.

Moreover, two memory cells use one source line (ground line) 15 in common. In this case, it is possible to set the current-driving line 24A on the source line 15. Furthermore, the current-driving line 24A is formed at the same level (wire layer) as the wire 20. That is, in the case of this example, it is possible to arrange wires with no wasteful space and contribute to reduction of a memory cell area.

It is preferable to set the current-driving lines 24A and 24B to positions as close to the TMR elements 31A and 31B as possible. Moreover, though the current-driving lines 24A and 24B are arranged immediately below or above the TMR elements 31A and 31B, there is no problem at all even if positions of the current-driving lines 24A and 24B are slightly shifted from positions of the TMR elements 31A and 31B.

Furthermore, in the top view of FIG. 32, a part of the bit line 23 is omitted in order to make patterns of the wires 22B and 22C and positions of the plugs 21 and 21' easily visible.

In FIG. 32, the wires 22B and 22C are hatched and the plugs 21 and 21' are shown by broken lines.

It is also allowed to write data in two TMR elements 31A and 31B set to the upper and lower sides of the common bit line 23 by using only one of the current-driving lines 24A and 24B. In this case, to write data in a TMR element farther from a current-driving line used for write, it is sufficient to generate a strong magnetic field by a large current or raise the sensitivity to the magnetic field of the TMR element.

Also in the case of the magnetic random access memory of the second example of the present invention, it is possible to store data of three values or more (or plurality of bits) in one memory cell and reduce the area of the memory cell by setting a TMR element (either one-layer TMR structure or a stacked TMR structure of a plurality of layers) to the upper and lower sides of a bit line or using a source line by two memory cells adjacent to each other in common.

THIRD EXAMPLE

Figure 34:
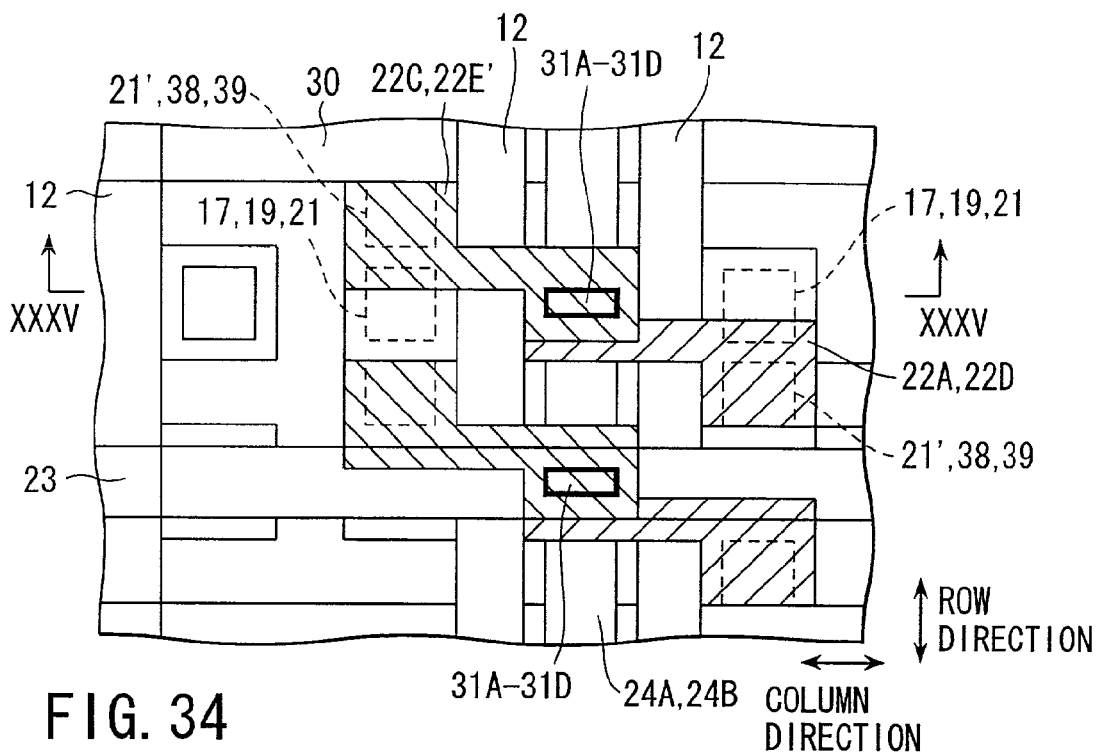
FIG. 34 is a top view showing a device structure of still another MRAM of the present invention.
Figure 35:
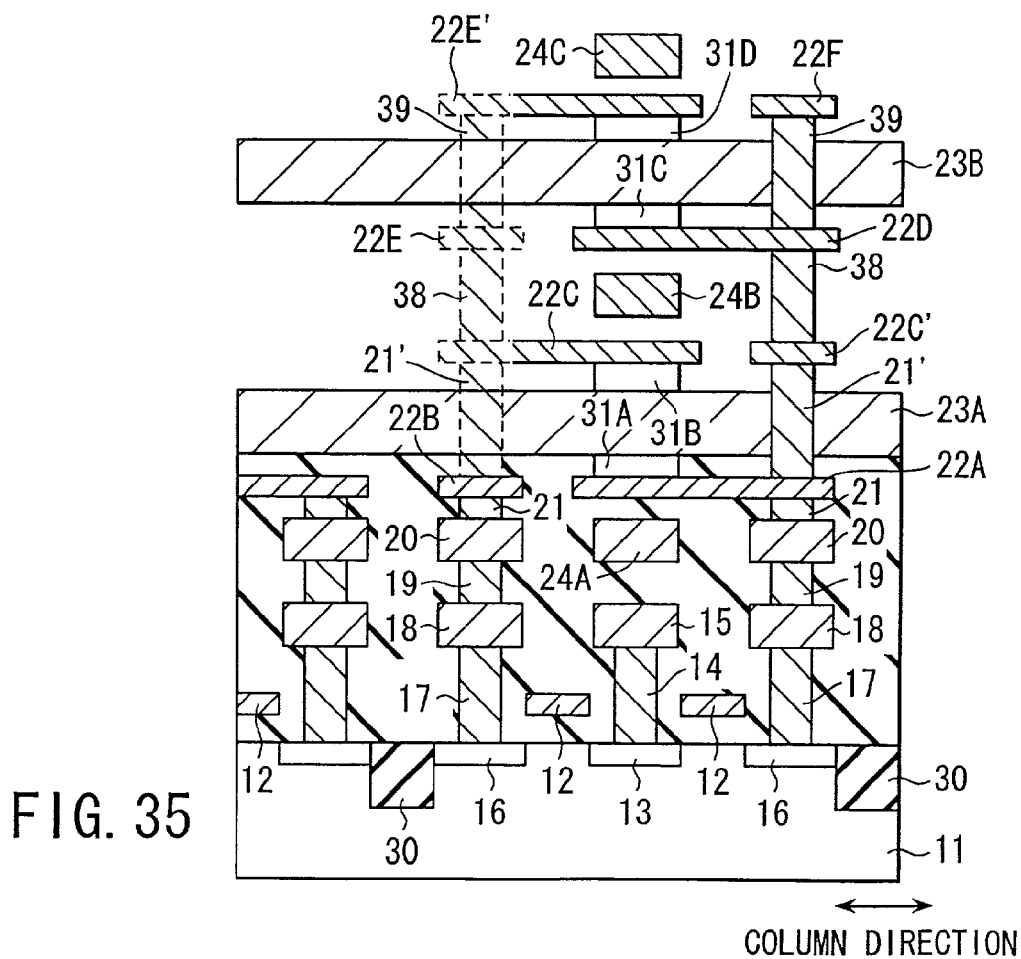
FIG. 35 is a sectional view along the line XXXV—XXXV in FIG. 34.

FIG. 34 is a top view showing the magnetic random w access memory of a third example of the present invention. FIG. 35 is a sectional view along the line XXXV—XXXV in FIG. 34.

The device structure of this example includes two features of the device structure of the above second example and moreover has features that a plurality of common bit lines 23A and 23B (two lines in the case of this example) are arranged in one column and a plurality of TMR elements are arranged between one MOS transistor and the common bit lines 23A and 23B.

In the case of this example, the common bit lines 23A and 23B arranged in one column are formed on different wire layers and divided into the first-layer common bit line 23A and the second-layer common bit line 23B above the first layer common bit line 23A. In the case of this example, the first-layer common bit line 23 and the second-layer common bit line 23B above the first-layer common bit line 23A are superimposed each other. However, it is also allowed that the first-layer common bit line 23 and the second-layer common bit line 23B above the first-layer common bit line 23A are overlapped or they are not overlapped each other at all.

Moreover, in the case of this example, the bit lines 23 AND 23B in one column are arranged on wire layers different from each other. However, it is also allowed to arrange them on the same wire layer.

A specific device structure is described below.

An element separation layer 30 having a STI (Shallow Trench Isolation) structure is set in a semiconductor substrate 11. The element separation layer 30 electrically separates a plurality of element areas from each other. Though the element separation layer 30 of this example uses the STI structure, it is allowed to use other structure (such as LOCOS structure).

A MOS transistor serving as a switching element is formed in an element area on the semiconductor substrate 11. The gate electrode of the MOS transistor serves as a read word line 12. In the case of this example, two MOS transistor are arranged in one element area. Moreover, these two MOS transistors use one source diffusion layer 13 in common.

Moreover, the source diffusion layer 13 of the MOS transistors is connected to a source line (ground line) 15 via a plug 14. That is, in the case of this example, two memory cells adjacent to each other in the column direction use one source diffusion layer 13 and one source line 15 in common.

The drain diffusion layer 16 of one of the two MOS transistors using the source diffusion layer 13 in common is connected to a TMR element 31A via plugs 17, 19, and 21 and wire layers 18, 20, and 22A and moreover, connected to a TMR element 31C via the plugs 17, 19, and 21 and plugs 21' and 38 and the wire layers 18, 20, and 22A and wire layers 22C' and 22D.

The plug 17 is constituted by a conductive polysilicon film containing an impurity or a metallic film and the plugs 19, 21, 21', and 38 and the wire layers 18, 20, 22A, 22C', and 22D are respectively constituted by a metallic film made of aluminum or copper. Moreover, it is allowed to use the stacked TMR element shown in FIG. 9 or 10 or the normal TMR element shown in FIG. 1 as the TMR elements 31A and 31C.

The TMR element 31A is set between the wire layer (local interconnection wire) 22A and the lower face of the first-layer common bit line 23A and the TMR element 31C is set between the wire layer (local interconnection wire) 22D and the lower face of the second-layer common bit line 23B.

A current-driving line 24A is set immediately below the TMR element 31A. The current-driving line 24A extends in the direction (row direction) vertical to the direction (column direction) in which the common bit lines 23A and 23B extend. Data is written in the TMR element 31A by magnetic fields generated by the current circulating through the common bit line 23A and the current circulating through the current-driving line 24A.

A current-driving line 24B is set immediately below the TMR element 31C. The current-driving line 24B extends in the direction (row direction) vertical to the direction (column direction) in which the common bit lines 23A and 23B extend. Data is written in the TMR element 31C by magnetic fields generated by the current circulating through the common bit line 23B and the current circulating through the current-driving line 24B.

The drain diffusion layer 16 of the other of the two MOS transistors using the source diffusion layer 13 in common is connected to the TMR element 31B via the plugs 17, 19, 21, and 21' and the wire layers 18, 20, 22B, and 22C and further connected to the TMR element 31D via the plugs 17, 19, 21, 21', and 38, and a plug 39 and the wire layers 18, 20, 22B, 22C, and wire layers 22E and 22E'.

The plug 17 is constituted by a conductive polysilicon film containing an impurity or a metallic film and the wire layers 18, 20, 22B, 22C, 22E, and 22E' are respectively constituted by a metallic film made of aluminum or copper. Moreover, it is allowed to use the stacked TMR element shown in FIG. 9 or 10 or the normal TMR element shown in FIG. 1 as the TMR elements 31B and 31D.

The TMR element 31B is set between the wire layer (local interconnection wire) 22C and the upper face of the first-layer common bit line 23A and the TMR element 31D is set between the wire layer (local interconnection wire) 22E' and the upper face of the second-layer common bit line 23B.

The current-driving line 24B is set immediately above the TMR element 31B. The current-driving line 24B extends in the direction (row direction) vertical to the direction (column direction) in which the common bit lines 23A and 213B extend. Data is written in the TMR element 31B by magnetic fields generated by the current circulating through the common bit line 23A and the current circulating through the current-driving line 24B.

A current-driving line 24C is set immediately above the TMR element 31D. The current-driving line 24C extends in the direction (row direction) vertical to the direction (column direction) in which the common bit lines 23A and 23B extend. Data is written in the TMR element 31D by magnetic fields generated by the current circulating through the common bit line 23B and the current circulating through the current-driving line 24C.

In the case of this example, the TMR elements 31A, 31B, 31C, and 31D are overlapped (superimposed) each other when viewed from the upper portion of the semiconductor substrate 11. However, it is allowed to set the TMR elements to positions at which they are overlapped each other or positions at which they are not overlapped at all.

Thus, in the case of the device structure of this example, a plurality of common bit lines 23A and 23B are arranged in one column and a TMR element is set to the upper and lower sides of the common bit lines 23A and 23B respectively.

In this case, the TMR elements 31A and 31C arranged on the lower sides of the common bit lines 23A and 23B are electrically connected to, one of a plurality of MOS transistors using one source line in common and moreover, patterns of the wires (local interconnection wires) 22A and 22D are improved so that the first-layer common bit line 23A does not contact with the plug 21'.

Moreover, the TMR elements 31B and 31D arranged on the upper sides of the common bit lines 23A and 23B are electrically connected to the other of the MOS transistors using one source line in common and moreover, patterns of the wires (local interconnection wires) 22B, 22C, 22E, and 22E' are improved so that the first-layer common bit line 23A does not contact with the plug 21' or the second-layer common bit line 23B does not connect with the plug 39.

Moreover, the current-driving line 24A is set immediately above the source line 15 and immediately below the TMR element 31A, the current-driving line 24B is set between the TMR elements 31B and 31C, and the current-driving line 24C is set immediately above the TMR element 31D. That is, the current-driving line 24A can be set t the same level (wire layer) as the wire 20 and moreover, the current-driving line 24B can be used to write data in the two TMR elements 31B and 31C. Therefore, in the case of this example, each wire can be set with no wasteful space and it is possible to contribute to reduction of a memory cell area.

It is preferable to set the current-driving lines 24A, 24B, and 24C to positions as close to the TMR elements 31A, 31B, 31C, and 31D as possible. Moreover, though the current-driving lines 24A, 24B and 24C are arranged immediately below or above the TMR elements 31A, 31B, 31C, and 31D in the case of this example, there is no problem at all even if positions of the current-driving lines 24A, 24B, and 24C are slightly deviated from those of the TMR elements 31A, 31B, 31C, and 31D.

Furthermore, it is allowed that the common bit lines 23A and 23B are electrically connected or separated each other on a memory cell array or at an end of the array.

Furthermore, in the top view in FIG. 34, a part of the bit line 23A and a part of the bit line 23B are omitted in order to make patterns of the wires 22A, 22C, 22D, and 22E' and positions of the plugs 21, 21', 38, and 39 easily visible. In FIG. 34, the wires 22A, 22C, 22D, and 22E' are hatched.

Also in the case of the magnetic random access memory of the third example of the present invention, it is possible to store the data of three values or more (or data of a plurality of bits) in one memory cell and reduce the area of a memory cell by arranging common bit lines in one column, setting a TMR element (TMR structure of one layer or stacked TMR structure of a plurality of layers is allowed) to the upper and lower sides of a common bit line, or using a source line in common by two memory cells adjacent to each other.

In the case of the device structure of this example, it is possible to individually perform the write operation for each of the TMR elements 31A, 31B, 31C, and 31D by controlling the current to be supplied to the common bit lines 23A and 23B and the current-driving lines 24A, 24B, and 24C.

For the read operation, however, when one read word line 12 is selected and one MOS transistor connected to the read word line 12 is turned on, a current is supplied to a plurality of TMR elements connected between the MOS transistor and the common bit lines 23A and 23B. In this case, it is assumed that the common bit lines 23A and 23B are electrically connected each other for the read operation.

Figure 36:
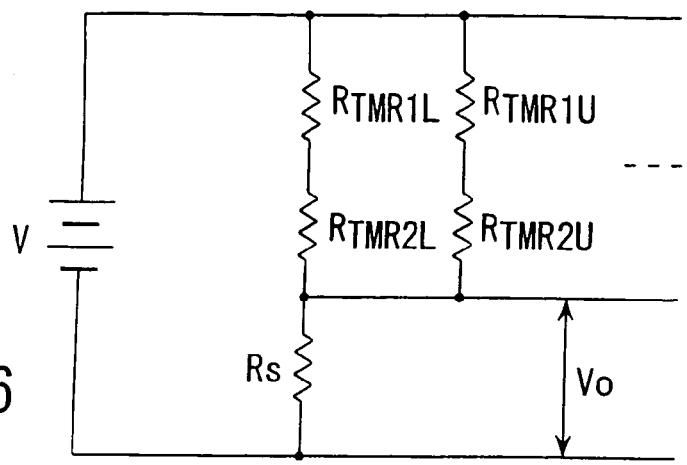
FIG. 36 is an illustration showing an equivalent circuit of the TMR structure in FIGS. 34 and 35.

FIG. 36 shows a memory cell and the equivalent circuit of a detection circuit for the read operation.

In this case, it is assumed that one memory cell is constituted by one MOS transistor and two TMR elements as shown in FIGS. 34 and 35. Moreover, it is assumed that each TMR element has the so-called stacked TMR structure comprising two TMR layers. Furthermore, it is assumed that a TMR element (two TMR layers) connected to the first-layer common bit line 23A has resistance values $R_{TMR1L}$ and $R_{TMR2L}$ and a TMR element connected to the second-layer common bit line 23B has resistance values $R_{TMR1U}$ and $R_{TMR2U}$.

In FIG. 36, symbol ". . ." denotes a case in which three common bit lines or more (three layers or more) are used. Because this example uses two common bit lines 23, only first and second layers are shown in FIG. 36.

In the case of this example, a plurality of TMR elements are connected between the power source V and the detection resistance Vo in parallel. Therefore, to read data from each TMR element, it is impossible to directly use the read-operation principle applied to the above first and second examples. This is because it may not possible to determine the data in the TMR element TMR1 connected to the first-layer common bit line 23A or the data in the TMR element TMR2 connected to the second-layer common bit line 23B.

Therefore, it is necessary to use a read-operation principle peculiar to this example.

The read-operation principle is described below.

First, because one memory cell includes two TMR elements, it is possible to store up to the data of 16 values, that is, $(R_{TMR1L}, R_{TMR2L}, R_{TMR1U},$ and $R_{TMR2U})$=(0,0,0,0), (0,0,0,1), (0,0,1,0), (0,0,1,1), (0,1,0,0), (0,1,0,1), (0,1,1,0), (0,1,1,1), (1,0,0,0), (1,0,0,1), (1,0,1,0), (1,0,1,1,), (1,1,0,0), (1,1,0,1), (1,1,1,0), and (1,1,1,1,).

Then, the read operation is performed in accordance with the following two stages.

First, the read word line 12 is set to "H" level for a selected memory cell and in this case, the value of the detection voltage Vo is measured.

For example, when setting high resistance values (="0") of the $R_{TMR1L}$ and $R_{TMR1U}$ to "4", low resistance values (="1") to "2", and the resistance value of the detection resistance Rs to 4, the synthetic resistance value of two TMR elements TMRL and TMRU becomes "2" and the detection voltage Vo becomes 2V/3 (=approx. 0.67V) when $(R_{TMR1L}, R_{TM2L}, R_{TMR1U},$ and $R_{TMR2U})$=(1,0,1,0,) is store in a memory cell.

Then, data "0" or data "1" is written in one TMR layer (selected TMR layer) in one TMR element from which data will be read.

For example, when a selected TMR layer is the TMR layer TMR2L in a TMR element TMRL to be connected to the first-layer common bit line 23A and data "1" is written, the data in a memory cell becomes $(R_{TMR1L}, R_{TMR2L}, R_{TMR1U},$ and $R_{TMR2U})$=(1,1,1,0).

Then, the read word line 12 of the selected memory cell is set to "H" level to measure the value of the then detection voltage Vo.

Because the data in the memory cell is $(R_{TMR1L}, R_{TMR2L}, R_{TMR1U},$ and $R_{TMR2U})$=(1,1,1,0), the synthetic resistance value of the two TMR elements TMRL and TMRU becomes "12/7" and the detection voltage Vo becomes 7V/10 (=approx. 0.7V). That is, because values of the detection voltages Vo before and after writing the data "1" in the TMR layer TMR2 are changed, it is found that the data stored in the TMR layer TMR2L is the data "0" opposite to the data "1".

Similarly, it is possible to read data from all of the TRM layers TMR1L, TMR1U, and TMR2U.

When writing the data "0" in the selected TMR layer TMR2L under the same condition as that of the above example, it is found that the data in the TMR layer TMR2L is the same value as the write data, that is, "0" because the detection voltage Vo is not changed before and after writing the data "0".

Thus, in the case of the read operation principle of this example, it is possible to determine that predetermined data is written in a selected TMR layer, the detection voltage Vo is measured before and after writing the data, and the data written in the TMR layer is the same as predetermined data (write data) when the detection voltage Vo is not changed but the data in the TMR layer is the data opposite to the predetermined data (write data) when the detection voltages Vo are changed.

In the case of the read operation principle of this example, when the detection voltages Vo are changed, it is determined that the data in a selected TMR lay is broken. Therefore, at least in this case, it is necessary to rewrite correct data after reading data from the selected TMR layer.

THIRD EXAMPLE

Figure 37:
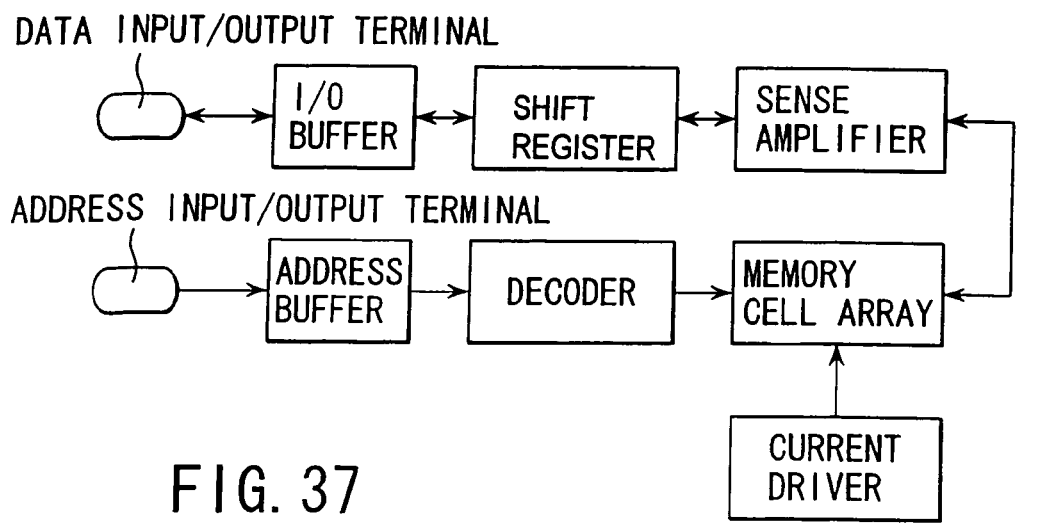
FIG. 37 is an illustration showing a write/read circuit of an MRAM of the present invention.
Figure 38:
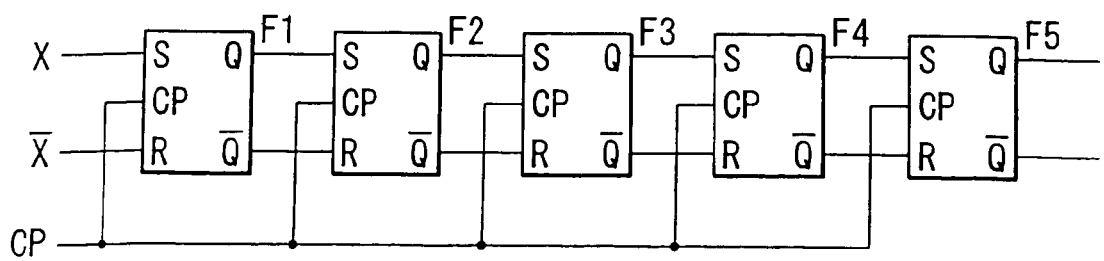
FIG. 38 is an illustration showing the shift register in FIG. 37.

FIG. 37 shows a system diagram of the magnetic random access memory of the third example of the present invention. Moreover, FIG. 38 shows an example of the shift register in FIG. 37.

In the case of a magnetic random access memory of the present invention, the TMR element is constituted by the TMR layers (for example, the stacked TMR structure) to store the data of three values or more (or two bits) in the YMR element in one memory cell.

In the case of a magnetic random access memory of the present invention, when writing two-bit data in a selected memory cell, it is necessary to previously decide a TMR layer for storing a low order bit of write data (two bits) and a TMR layer for storing a high order bit of the data.

Therefore, two-bit data input from a data input/output terminal is temporarily stored in a shift register under the write operation. Then, while the two-bit data is stored, a TMR layer for storing a low order bit of the write data and a TMR layer for storing a high order bit of the data are decided.

When TMR layers for storing each bit of the write data are decided, the high order bit and low order bit of the write data are successively stored in the TMR elements.

For example, when two TMR layers have the asteroid curve shown in FIG. 5, predetermined one-bit data is output from a shift register to write the data in the TMR layer TMR1 in a selected memory cell in accordance with an address signal. In this case, the data is also written in the TMR layer TMR2 in the selected memory cell.

Thereafter, remaining one-bit data is output from the shifter register to write the data in the TMR layer TMR2 in the selected memory cell.

According to the above system, even when a TMR element is constituted by two or more TMR layers and the data of three values or more (or data of a plurality of bits) is stored in one memory cell, one-bit data can be successively stored in TMR layers because it is possible to temporarily store write data by a shift register.

Moreover, under the read operation, it is allowed to temporarily store the data read from each TMR layer in a TMR element in a shift register and then, output the data of three value or more (or data of a plurality of bits) read from a memory cell to the outside of a memory in parallel or in series.

For read, it is also allowed to output read data to t he outside of a memory immediately after reading the data without temporarily storing the data in a shift register.

Moreover, as shown in FIG. 38, this example is constituted by a plurality of flip-flop circuits connected in series. However, it is also allowed to use a shift register constituted by a configuration other than the above configuration.

As described above, according to the magnetic random access memory of an example of the present invention, it is possible to store the data of three values or more (or data of a plurality of bits) in a memory cell by constituting a TMR element in the memory cell by a plurality of TMR layers. Moreover, in the case of a device structure for realizing the above memory, it is possible to improve the integration level of a memory cell because the device structure is suitable for reduction of the area of the memory cell. Furthermore, by using new write-operation principle and read-operation principle, it is possible to perform the write and read operations without deteriorating characteristics while securing a sufficient margin.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a tunnel magnetoresistive (TMR) element having first and second TMR layers stacked on each other;
    first and second current driving lines configured to generate magnetic fields for storing data to each of said first and second TMR layers, and to cross each other;
    said first and second TMR layers are located between said first and second current driving lines; and
    a value of a current of said first current driving line is greater than that of said second current driving line when data is written in said second TMR layer, and a value of a current of said second current driving line is greater than that of said first current driving line when data is written in said first TMR layer.

2. The magnetic random access memory according to claim 1, further comprising;
    a source line; and
    a switching element connected between said TMR element and said source line,
    wherein said switch element turns on when data is read out from said TMR element.

3. The magnetic random access memory according to claim 2,
    wherein the second current driving line and the source line are overlapped each other and extend in the same direction.

4. The magnetic random access memory according to claim 1,
    wherein each of said first and second TMR layers has magnetic layers and an insulating layer between said magnetic layers, and a direction of a spin of one of said magnetic layers is fixed by an antimagnetic layer.

5. The magnetic random access memory according to claim 4,
    wherein said TMR element has a nonmagnetic conductive layer provided between said first and second TMR layers.

6. The magnetic random access memory according to claim 4,
    wherein said antimagnetic layer is provided between said first and second TMR layers.

7. The magnetic random access memory according to claim 4,
    wherein each of said first and second TMR layers stores data based on the direction of the spin of one of said magnetic layers.

8. The magnetic random access memory according to claim 4,
    wherein a thickness of said insulating layer determines a value of a resistance of each of said first and second TMR layers.

9. The magnetic random access memory according to claim 1,
    wherein the first current driving line is a bit line and said TMR element is in contact with said bit line.

10. The magnetic random access memory according to claim 9,
    wherein the second current driving line and the bit line are at right angles to each other.

11. The magnetic random access memory according to claim 10,
    wherein said TMR element is in contact with an under surface of said bit line and the second current driving line is provided directly under said TMR element.

12. The magnetic random access memory according to claim 1,
    wherein each of said first and second TMR layers receives a magnetic field intensity dependent on currents of said first and second current driving lines, as a result, the data is written in each of said first and second TMR layers individually.

13. The magnetic random access memory according to claim 12,
    wherein said first and second TMR layers are separated from each other.

14. The magnetic random access memory according to claim 1,
    wherein the asteroid curves of said first and second TMR layers are different from each other and the data is written in each of said first and second TMR layers individually.

15. The magnetic random access memory according to claim 14,
    wherein a data write operation begins with the first TMR layer and ends with the second TMR layer, and a strongest magnetic field intensity is required for the first TMR layer to change the data and a weakest magnetic field intensity is required for the second TMR layer to change the data.

16. The magnetic random access memory according to claim 1,
wherein a current of the first current driving line flows in only one direction and a current of the second current driving line flows in one direction or another direction.

17. The magnetic random access memory according to claim 1, further comprising:
a detecting resistance connected to said TMR element,
wherein the data of said TMR element is detected based on a voltage of said detecting resistance in a read operation.

18. The magnetic random access memory according to claim 17,
wherein said detecting resistance is provided at an outer portion of a memory cell array portion.

19. The magnetic random access memory according to claim 17, further comprising:
the power source electrically connected to said TMR element in a read operation and generates a read current.

20. The magnetic random access memory according to claim 1, further comprising:
a register temporarily latches the data having a plurality of bits.

* * * * *